(12) United States Patent
Song et al.

(10) Patent No.: US 12,284,838 B2
(45) Date of Patent: Apr. 22, 2025

(54) IMAGE SENSOR

(71) Applicant: SAMSUNG ELECTRONICS CO., LTD., Suwon-si (KR)

(72) Inventors: Jiyoun Song, Seoul (KR); Ingyu Baek, Seoul (KR); Daehoon Kim, Seoul (KR); Seungsik Kim, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 462 days.

(21) Appl. No.: 17/647,348

(22) Filed: Jan. 7, 2022

(65) Prior Publication Data

US 2022/0231060 A1 Jul. 21, 2022

(30) Foreign Application Priority Data

Jan. 18, 2021 (KR) ........................ 10-2021-0006813

(51) Int. Cl.
*H01L 27/146* (2006.01)
*H10F 39/00* (2025.01)
(Continued)

(52) U.S. Cl.
CPC ......... *H10F 39/802* (2025.01); *H10F 39/014* (2025.01); *H10F 39/182* (2025.01);
(Continued)

(58) Field of Classification Search
None
See application file for complete search history.

(56) References Cited

U.S. PATENT DOCUMENTS 9,673,708 B2 6/2017 Hwang
11,665,452 B2 5/2023 Baek et al.
(Continued)

FOREIGN PATENT DOCUMENTS

KR 10-0660832 12/2006
KR 10-0817409 3/2008
KR 10-2020-0140445 A 12/2020

OTHER PUBLICATIONS

Office Action dated Mar. 6, 2023 issued in Korean Patent Application No. 10-2021-006813.

*Primary Examiner* — Kyoung Lee
(74) *Attorney, Agent, or Firm* — F. CHAU & ASSOCIATES, LLC

(57) ABSTRACT

Provided is an image sensor including a semiconductor substrate having first and second surfaces, transistors on the first surface, first and second lower pad electrodes apart from each other on a first interlayer insulating film covering the transistors, a mold insulating layer on the first and second lower pad electrodes, a first lower electrode inside a first opening passing through the mold insulating layer on the first lower pad electrode, a second lower electrode inside a second opening passing through the mold insulating layer on the second lower pad electrode, a dielectric film and an upper electrode on the first and second lower electrodes, a first contact plug passing through the mold insulating layer and connected to the first lower pad electrode, and a second contact plug passing through the mold insulating layer and connected to the second lower pad electrode.

18 Claims, 23 Drawing Sheets

(51) Int. Cl.
  *H10F 39/12* (2025.01)
  *H10F 39/18* (2025.01)
  *H04N 25/53* (2023.01)
  *H04N 25/77* (2023.01)

(52) U.S. Cl.
  CPC ....... *H10F 39/199* (2025.01); *H10F 39/8053* (2025.01); *H10F 39/8063* (2025.01); *H10F 39/807* (2025.01); *H10F 39/811* (2025.01); *H04N 25/53* (2023.01); *H04N 25/77* (2023.01)

(56) References Cited

U.S. PATENT DOCUMENTS

| | | |
|---|---|---|
| 2020/0058688 A1 | 2/2020 | Kwon et al. |
| 2020/0058707 A1 | 2/2020 | Choi et al. |
| 2020/0105810 A1 | 4/2020 | Moon et al. |
| 2020/0111831 A1 | 4/2020 | Choi et al. |
| 2020/0127034 A1 | 4/2020 | Zhang et al. |
| 2020/0389608 A1* | 12/2020 | Baek ................. H01L 28/60 |

\* cited by examiner

A2 - A2'

A3 - A3'

A3 – A3'

IMAGE SENSOR

CROSS-REFERENCE TO RELATED APPLICATION

This application claims priority under 35 U.S.C. § 119 to Korean Patent Application No. 10-2021-0006813, filed on Jan. 18, 2021, in the Korean Intellectual Property Office, the disclosure of which is incorporated by reference herein in its entirety.

TECHNICAL FIELD

The present inventive concept relates to an image sensor, and more particularly, to an image sensor including a photodiode.

DISCUSSION OF RELATED ART

An image sensor may be a device configured to convert an optical image into an electric signal, and may have a plurality of pixels. Each of the pixels may include a photodiode region configured to receive incident light and convert the incident light into an electron-hole pair, therefore generating charges, and a pixel circuit may output a pixel signal using the charges generated in the photodiode region.

Due to the increased demand for image sensors, image sensors capable of embodying not only color images but also three-dimensional (3D) images are being developed. In addition, the image sensors may employ a global shutter scheme, in which all the pixels are simultaneously exposed to provide high quality imaging at high speeds.

SUMMARY

The present inventive concept provides an image sensor, which has enhanced shutter efficiency and may prevent noise from occurring.

According to an example embodiment of the present inventive concept, there is provided an image sensor including a semiconductor substrate having a first surface and a second surface. Transistors are disposed on the first surface of the semiconductor substrate. First and second lower pad electrodes are spaced apart from each other on a first interlayer insulating film, and the first interlayer insulating film covers the transistors. A mold insulating layer is disposed on the first and second lower pad electrodes. A first lower electrode is formed inside a first opening, and the first opening passes through the mold insulating layer. The first lower electrode is on the first lower pad electrode. A second lower electrode is formed inside a second opening, and the second opening passes through the mold insulating layer. The second lower electrode is on the second lower pad electrode. A dielectric film and an upper electrode are disposed on the first lower electrode and the second lower electrode. A first contact plug passes through the mold insulating layer and is connected to a top surface of the first lower pad electrode. A second contact plug passes through the mold insulating layer and is connected to a top surface of the second lower pad electrode.

According to an example embodiment of the present inventive concept, there is provided an image sensor including a semiconductor substrate having a first surface and a second surface. A photoelectric conversion region is formed in the semiconductor substrate. Transistors are disposed on the first surface of the semiconductor substrate. First and second lower pad electrodes are spaced apart from each other on a first interlayer insulating film that covers the transistors. Each of the first and second lower pad electrodes has a main pad portion having a rectangular horizontal cross-section and an extension protruding from the main pad portion. A plurality of first lower electrodes are disposed on the first lower pad electrode. A plurality of second lower electrodes are disposed on the second lower pad electrode. A dielectric film and an upper electrode are sequentially formed on a sidewall and a top surface of each of the plurality of first lower electrodes and a sidewall and a top surface of each of the plurality of second lower electrodes. A first contact plug is located on a top surface of the extension of the first lower pad electrode. A second contact plug is located on a top surface of the second lower pad electrode.

According to an example embodiment of the present inventive concept, there is provided an image sensor including a semiconductor substrate having a first surface and a second surface. A photoelectric conversion region is formed in the semiconductor substrate. Transistors are disposed on the first surface of the semiconductor substrate. First and second lower pad electrodes are spaced apart from each other on a first interlayer insulating film, and the first insulating film covers the transistors. A mold insulating layer is disposed on the first and second lower pad electrodes. A first lower electrode is formed inside a first opening, and the first opening passes through the mold insulating layer. The first lower electrode is on the first lower pad electrode and has a cylindrical shape. A second lower electrode is formed inside a second opening, and the second opening passes through the mold insulating layer. The second lower electrode is on the second lower pad electrode and has a cylindrical shape. A dielectric film and an upper electrode are formed on the first lower electrode and the second lower electrode. An upper pad electrode is disposed on the upper electrode and includes a doped semiconductor material. A second interlayer insulating film covers the mold insulating layer and the upper pad electrode. First and second contact plugs pass through the mold insulating layer and the second interlayer insulating film and are connected to top surfaces of the first and second lower pad electrodes, respectively.

BRIEF DESCRIPTION OF THE DRAWINGS

Example embodiments of the present inventive concept will be more clearly understood from the following detailed description taken in conjunction with the accompanying drawings in which.

Figure 1:
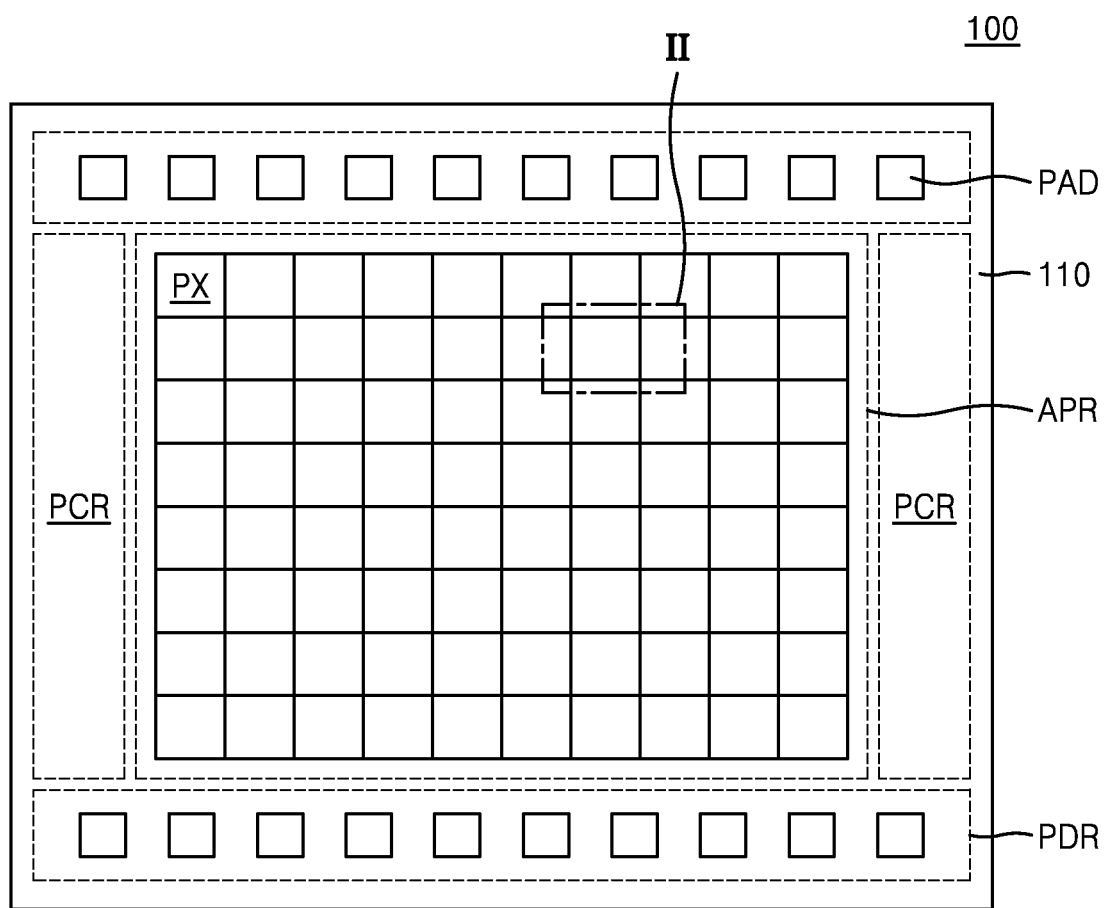
FIG. 1 is a layout diagram of an image sensor according to an example embodiment of the present inventive concept.

Since the drawings in FIGS. 1-23 are intended for illustrative purposes, the elements in the drawings are not necessarily drawn to scale. For example, some of the elements may be enlarged or exaggerated for clarity purpose.

DETAILED DESCRIPTION OF THE EMBODIMENTS

Hereinafter, example embodiments will be described in detail with reference to the accompanying drawings.

FIG. 1 is a diagram illustrating the layout of an image sensor 100 according to an example embodiment of the present inventive concept.

Referring to FIG. 1, the image sensor 100 may include an active pixel region APR, a peripheral circuit region PCR, and a pad region PDR, which are formed in a semiconductor substrate 110.

The active pixel region APR may be in a central portion of the semiconductor substrate 110, and the peripheral circuit region PCR may be on both sides of the active pixel region APR. For example, the peripheral circuit region PCR may be on the right side and the left side of the active pixel region APR. A pad region PDR may be in an edge portion of the semiconductor substrate 110. For example, the pad region PDR may be in the top edge portion and at the bottom edge portion in a view from above.

The active pixel region APR may include a plurality of pixels PX, and a plurality of photoelectric conversion regions (refer to PD in FIG. 4) may be respectively in the plurality of pixels PX. In the active pixel region APR, the plurality of pixels PX may be arranged in a matrix form of rows and columns in a first direction parallel to a top surface of the semiconductor substrate 110 and a second direction parallel to the top surface of the semiconductor substrate 110. The second direction may be perpendicular to the first direction. However, the present inventive concept is not limited thereto. For example, the plurality of pixels PX may be arranged in a pentile matrix shape, or a diamond shape.

Although the peripheral circuit region PCR is illustrated as being on both sides of the active pixel region APR in a view from above, the present inventive concept is not limited thereto, and the peripheral circuit region PCR may entirely surround the active pixel region APR. Alternatively, the peripheral circuit region PCR may surround three sides of the active pixel region APR. A conductive pad PAD may be in the pad region PDR. The conductive pad PAD may be on the edge portion of the semiconductor substrate 110.

Figure 2:
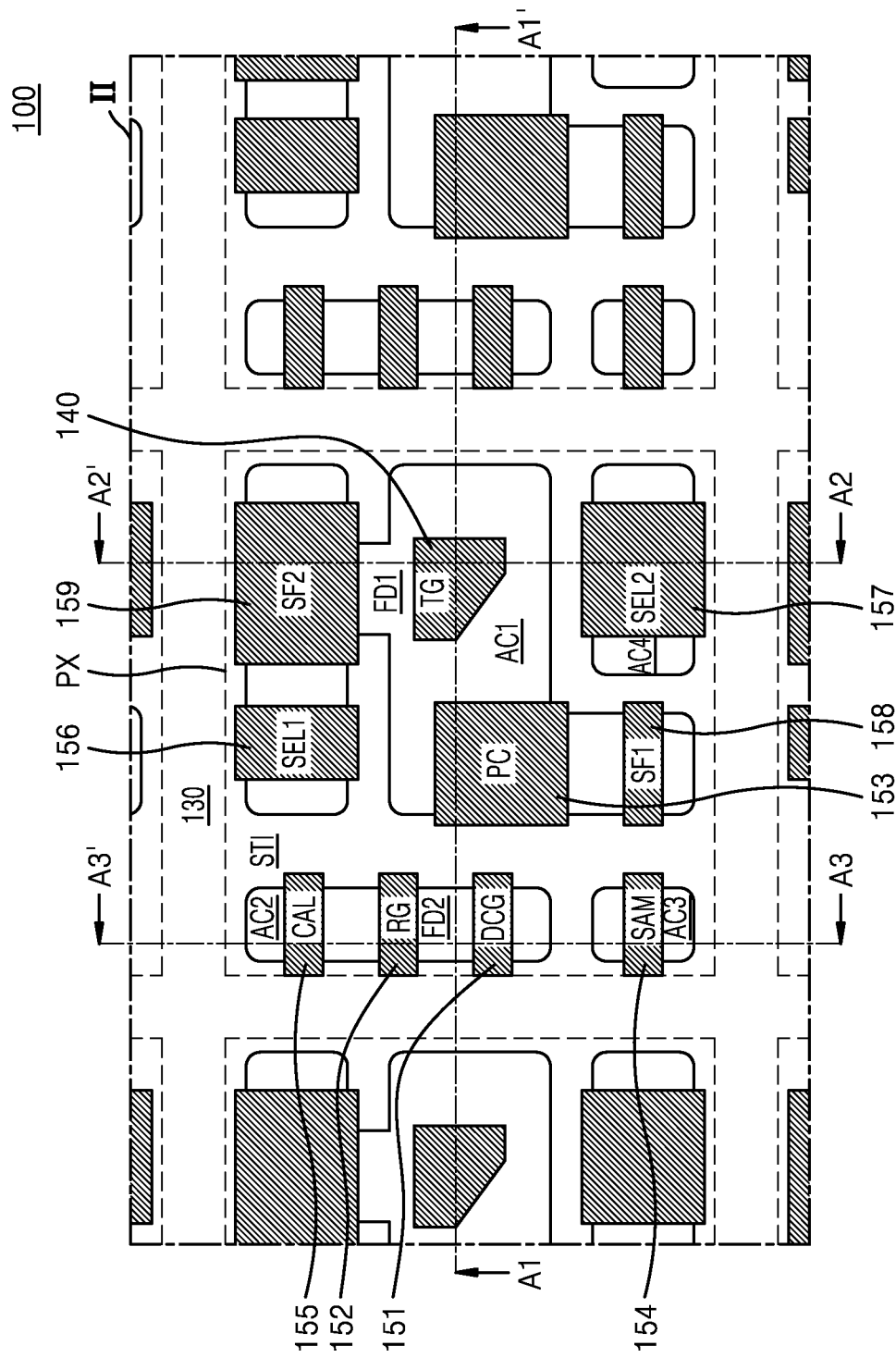
FIGS. 2 and 3 are layout diagrams of an image sensor according to an example embodiment of the present inventive concept.
Figure 3:
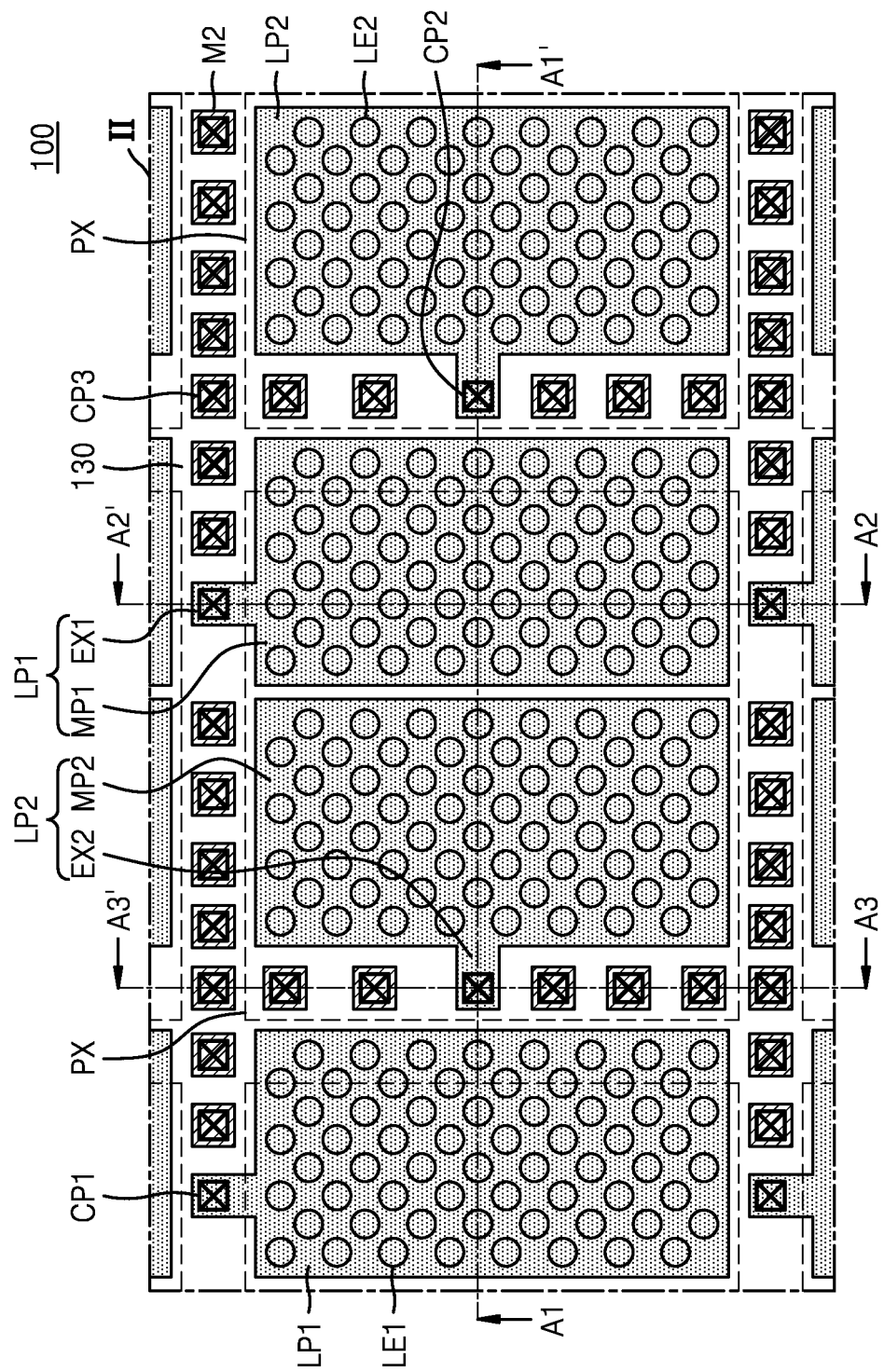
Figure 4:
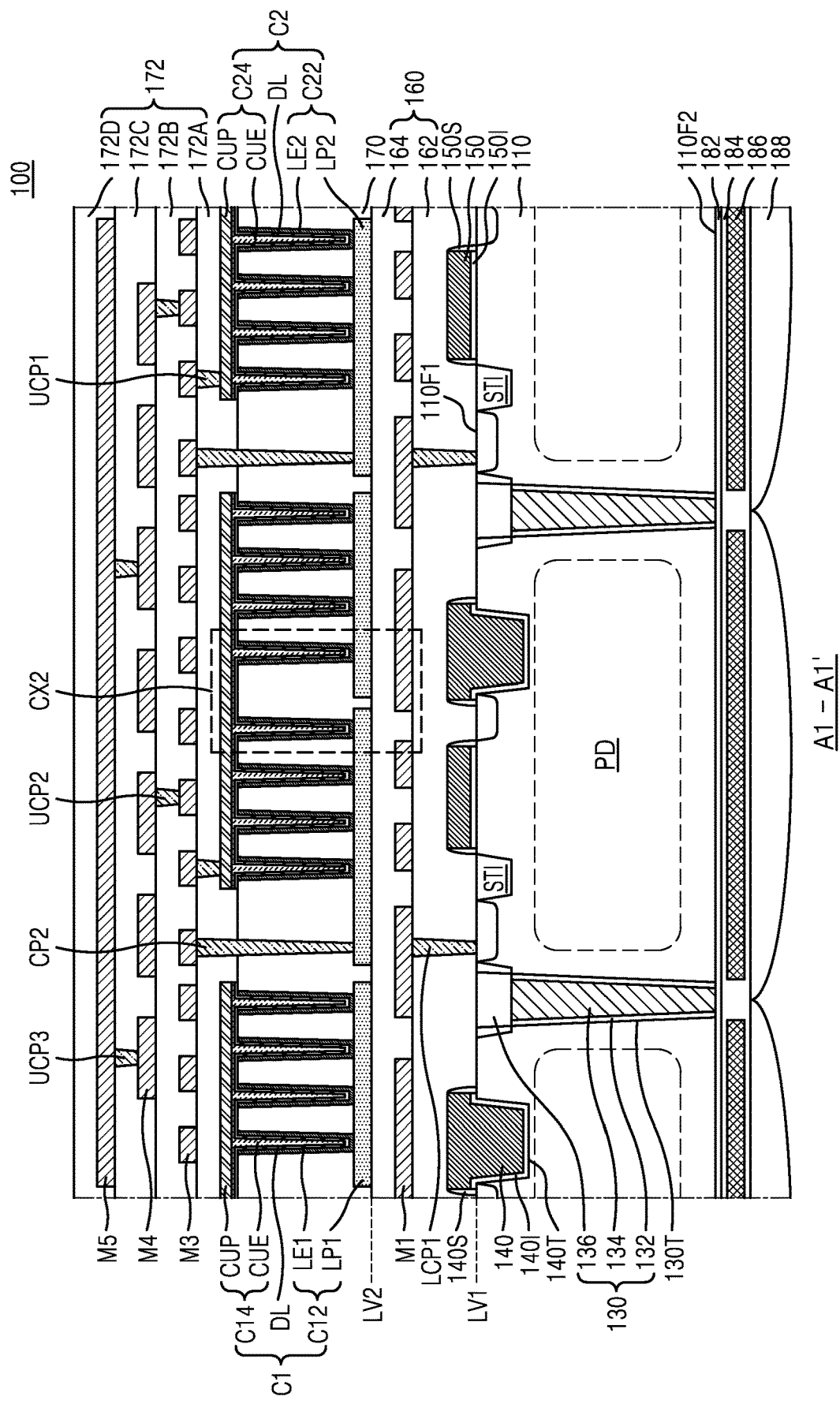
FIG. 4 is a cross-sectional view taken along line A1-A1' of FIGS. 2 and 3.
Figure 5:
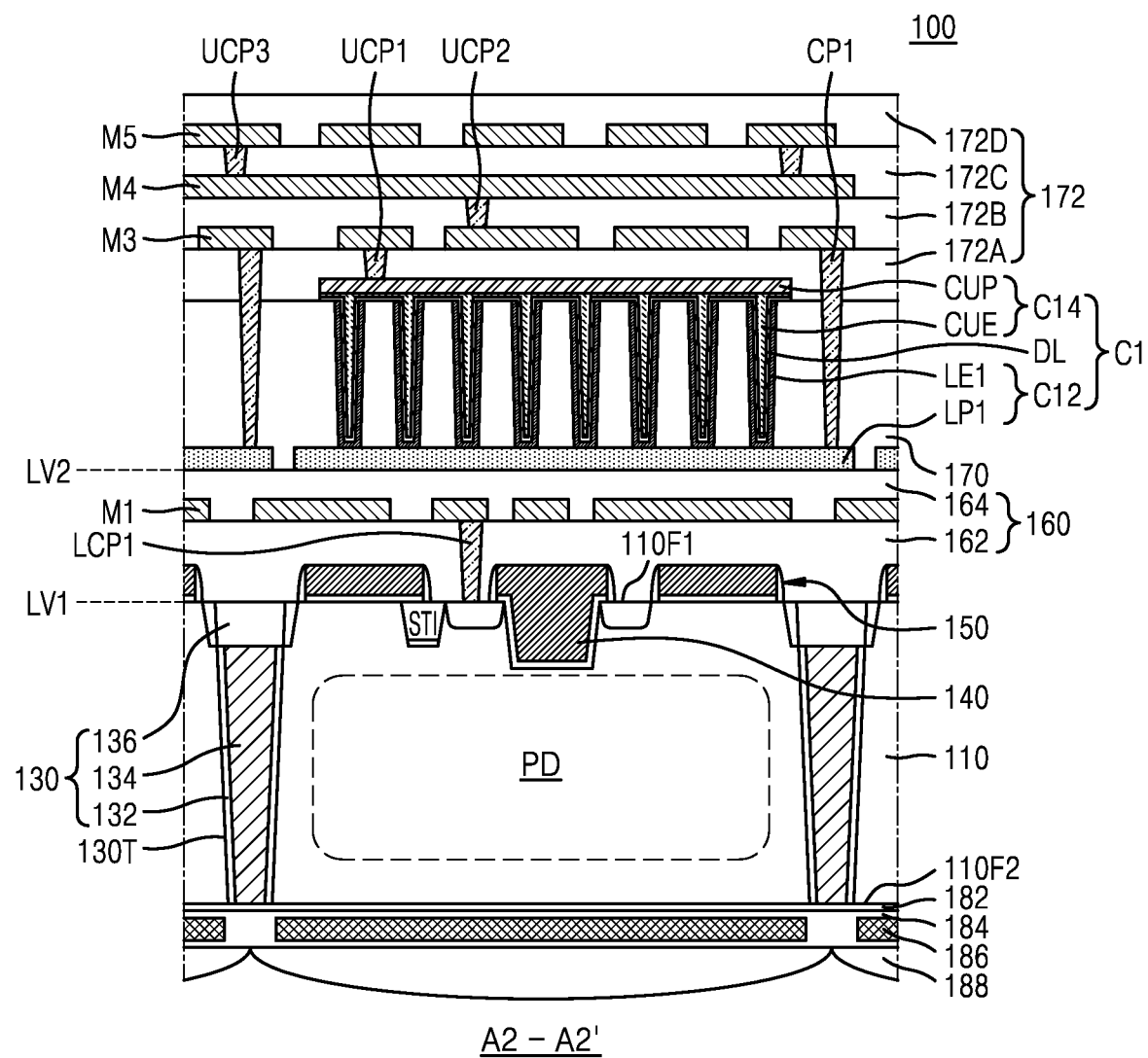
FIG. 5 is a cross-sectional view taken along line A2-A2' of FIGS. 2 and 3.
Figure 6:
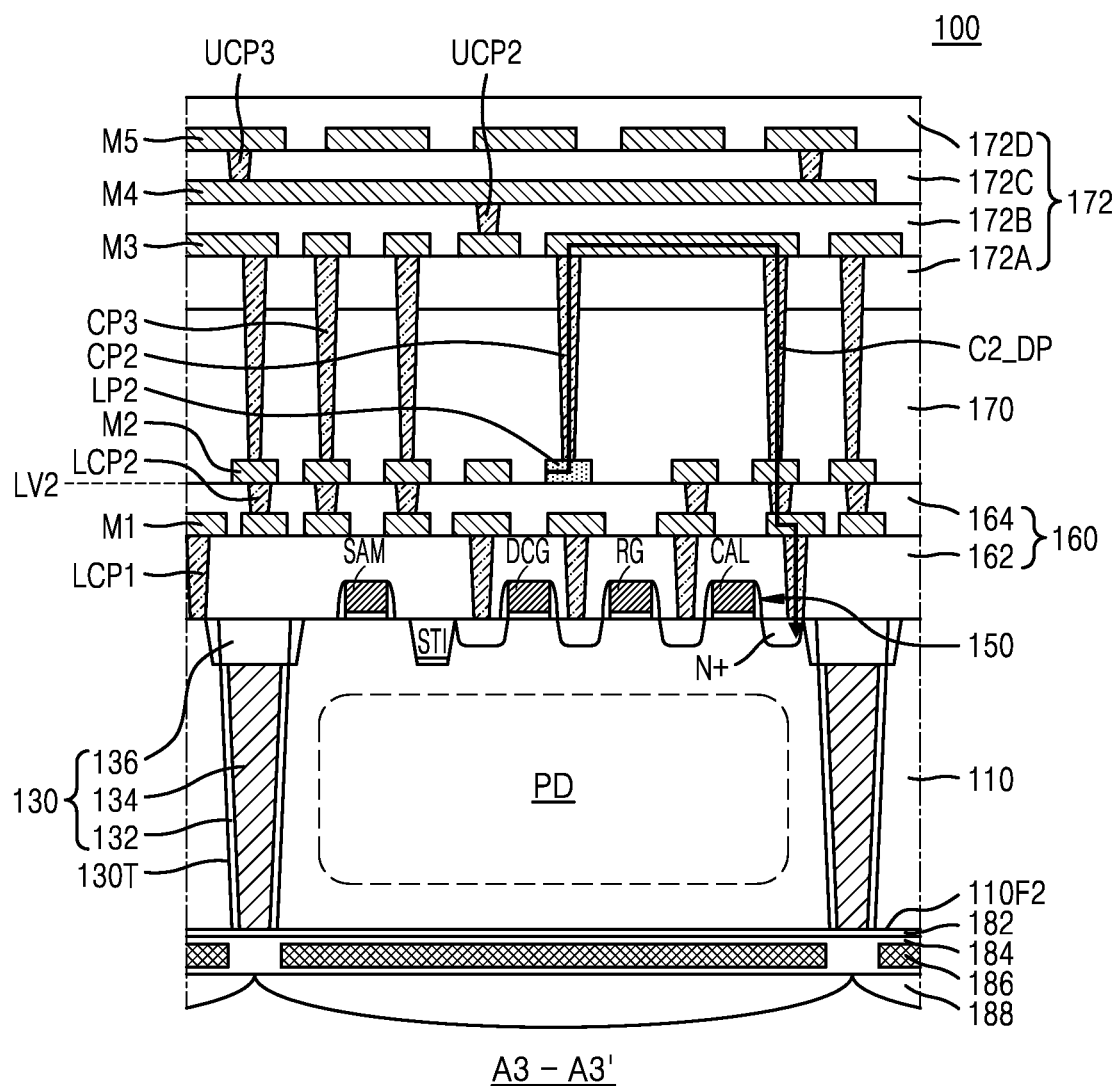
FIG. 6 is a cross-sectional view taken along line A3-A3' of FIGS. 2 and 3.
Figure 7:
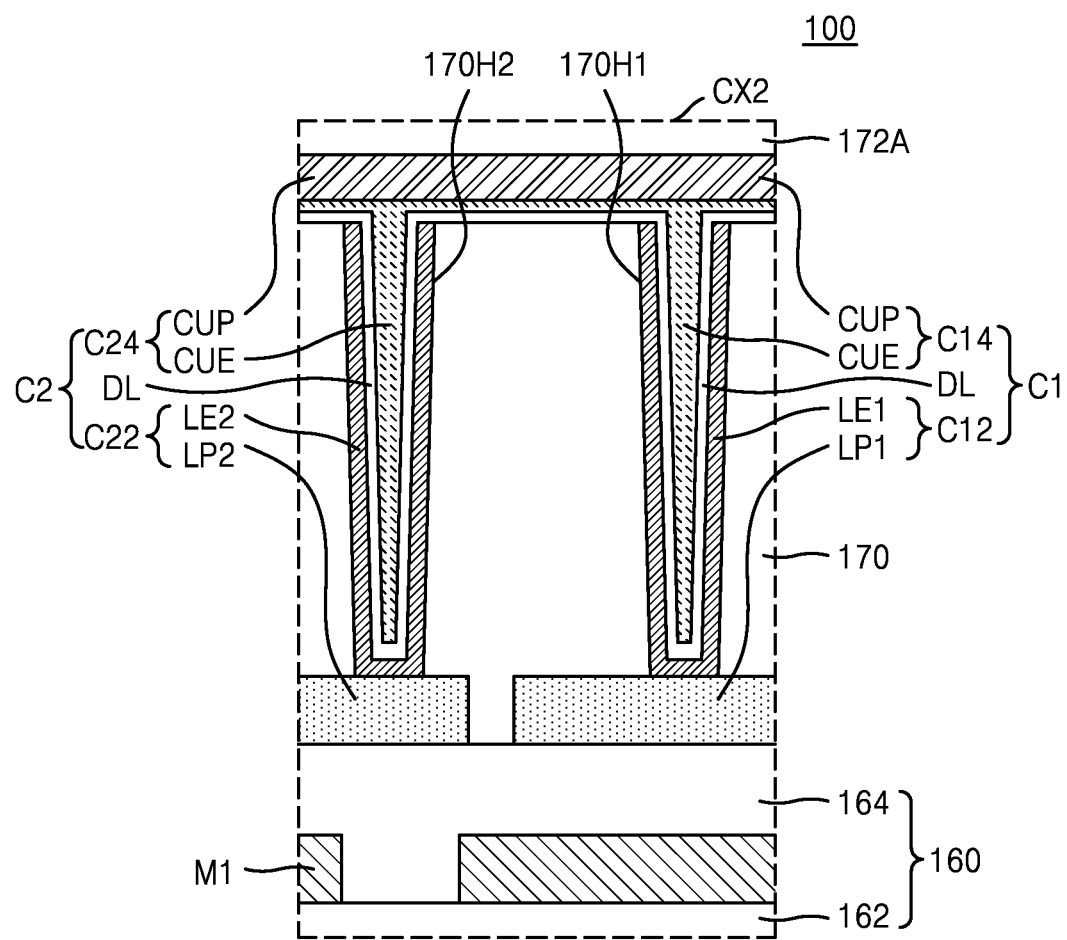
FIG. 7 is an enlarged view of region CX2 of FIG. 4.
Figure 8:
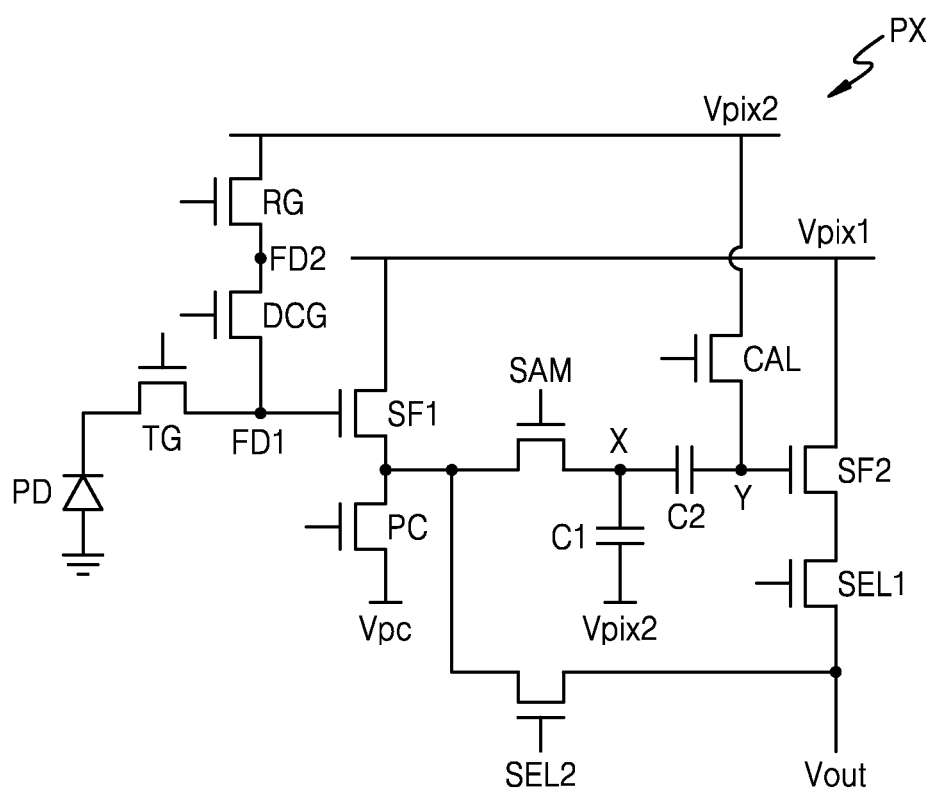
FIG. 8 is a circuit diagram of a pixel of an image sensor, according to an example embodiment of the present inventive concept.

FIGS. 2 and 3 are diagrams illustrating the layout of an image sensor 100 according to an example embodiment of the present inventive concept. For example, FIG. 2 is an enlarged layout diagram of region II of FIG. 1 at a first vertical level LV1, and FIG. 3 is an enlarged layout diagram of region II of FIG. 1 at a second vertical level LV2 (see FIG. 4). FIG. 4 is a cross-sectional view taken along line A1-A1' of FIGS. 2 and 3. FIG. 5 is a cross-sectional view taken along line A2-A2' of FIGS. 2 and 3. FIG. 6 is a cross-sectional view taken along line A3-A3' of FIGS. 2 and 3. FIG. 7 is an enlarged view of region CX2 of FIG. 4. FIG. 8 is a circuit diagram of a pixel PX of the image sensor 100, according to an example embodiment of the present inventive concept.

Referring to FIGS. 2 to 8, the image sensor 100 may include an image sensor of a global shutter type. During an operation of the image sensor of the global shutter type, charges may be simultaneously stored in each of pixels PX by simultaneously exposing all the pixels PX, and pixel signals may be sequentially output for each row. For example, because the image sensor of the global shutter type exposes all of the pixels PX at the same time, it may enable the capture of distortion-free images in comparison to a rolling shutter type.

The pixel PX of the image sensor 100 may include a photoelectric conversion region PD, a transfer transistor TG, a first floating diffusion region FD1, a reset transistor RG, a dual conversion gain (DCG) transistor DCG, a second floating diffusion region FD2, a first source follower transistor SF1, a pre-charge transistor PC, a sample transistor SAM, a first capacitor C1, a second capacitor C2, a calibration transistor CAL, a second source follower transistor SF2, a first selection transistor SEL1, a second selection transistor SEL2, a first node X, and a second node Y.

One pixel PX may be electrically insulated from a pixel PX adjacent thereto by a pixel device isolation film 130. For example, each pixel PX may be surrounded by the pixel device isolation film 130. First to fourth active regions AC1, AC2, AC3, and AC4 may be defined in one pixel PX by a device isolation film STI. The photoelectric conversion region PD, the transfer transistor TG, the first floating diffusion region FD1, the first source follower transistor SF1, the pre-charge transistor PC, the second source follower transistor SF2, and the first selection transistor SEL1 may be in the first active region AC1. The reset transistor RG, the DCG transistor DCG, the second floating diffusion region FD2, and the calibration transistor CAL may be in the second active region AC2. The sample transistor SAM may be in the third active region AC3, and the second selection transistor SEL2 may be in the fourth active region AC4.

The photoelectric conversion region PD may be in the first active region AC1 and include, for example, an N-type impurity region. Electric charge may be generated from the photoelectric conversion region PD by, for example, absorbing light. The first floating diffusion region FD1 may be adjacent to the photoelectric conversion region PD in the first active region AC1. A transfer gate electrode 140 of the transfer transistor TG may be adjacent to the first floating diffusion region FD1. The photoelectric conversion region PD may be coupled with the transfer transistor TG that transfers the accumulated charge to the first floating diffusion region FD1.

A DCG gate electrode 151 of the DCG transistor DCG and a reset gate electrode 152 of the reset transistor RG may be on the second active region AC2, and the second floating diffusion region FD2 may be in the second active region AC2 between the DCG gate electrode 151 and the reset gate electrode 152. The second floating diffusion region FD2 may be shared between the reset transistor RG and the DCG transistor DCG. The second floating diffusion region FD2 may serve as sources or drains of the reset transistor RG and the DCG transistor DCG. The first and second floating diffusion regions FD1 and FD2 may be regions which convert charges into voltages, and charges may be accumulatively stored in the first and second floating diffusion regions FD1 and FD2.

In an example embodiment of the present inventive concept, the DCG transistor DCG may be connected between the first floating diffusion region FD1 and the reset transistor RG. The reset transistor RG may be connected to the first floating diffusion region FD1 via the DCG transistor DCG. Alternatively, the reset transistor RG may be connected between the first floating diffusion region FD1 and the DCG transistor DCG. The reset transistor RG and the DCG transistor DCG may be connected in series to the first floating diffusion region FD1. Alternatively, the DCG transistor DCG may be omitted.

The pre-charge transistor PC may be connected to the first source follower transistor SF1, and a pre-charge gate electrode 153 of the pre-charge transistor PC may be on the first active region AC1. The sample transistor SAM may be connected between the first source follower transistor SF1 and the pre-charge transistor PC, and a sample gate electrode 154 of the sample transistor SAM may be on the third active region AC3. The calibration transistor CAL may be connected to a third electrode C22 of the second capacitor C2, and a calibration gate electrode 155 of the calibration transistor CAL may be on the second active region AC2. For example, the second capacitor C2 may be between the calibration transistor CAL and the first capacitor C1, and by increasing the capacitance of the second capacitor C2, the noise generated when calibration transistor CAL is turned off may be reduced.

The first selection transistor SEL1 may be connected to a second source follower transistor SF2. A first selection gate electrode 156 of the first selection transistor SEL1 and a first source follower gate electrode 158 of the first source follower transistor SF1 may be connected to the first floating diffusion region FD1. A fourth electrode C24 of the second capacitor C2 may be connected to the sample transistor SAM and a second electrode C14 of the first capacitor C1. The second source follower gate electrode 159 of the second source follower transistor SF2 may be connected to the calibration transistor CAL and the third electrode C22 of the second capacitor C2. The first selection gate electrode 156 of the first selection transistor SEL1, the first source follower gate electrode 158 of the first source follower transistor SF1, the transfer gate electrode 140 of the transfer transistor TG, and the second source follower gate electrode 159 of the second source follower transistor SF2 may be on the first active region AC1.

One end of each of the reset transistor RG, the first source follower transistor SF1, the second source follower transistor SF2, and the calibration transistor CAL may be connected to a power source Vpix. One end of each of the first source follower transistor SF1 and the second source follower transistor SF2 may be connected to the first power source Vpix1, and one end of each of the reset transistor RG and the calibration transistor CAL may be connected to a second power source Vpix2. One end of the pre-charge transistor PC may be connected to a pre-charge voltage Vpc. In an example embodiment of the present inventive concept, the pre-charge voltage Vpc may be a ground voltage. A first electrode C12 of the first capacitor C1 may be connected to the second power source Vpix2. One end of the first selection transistor SEL1 and one end of the second selection transistor SEL2 may be connected to a power line Vout. The second selection gate electrode 157 of the second selection transistor SEL2 may be on the fourth active region AC4.

One end of the sample transistor SAM may be connected to the second electrode C14 of the first capacitor C1 and the fourth electrode C24 of the second capacitor C2 to constitute the first node X. Another end of the sample transistor SAM may be connected to one end of the second selection transistor SEL2 and another end of the first source follower transistor SF1. Another end of the calibration transistor CAL may be connected to the third electrode C22 of the second capacitor C2 and the second source follower gate electrode 159 of the second source follower transistor SF2 to constitute the second node Y.

Although FIG. 2 illustrates an example layout of the pixel PX, in another case, the second selection transistor SEL2 may be omitted, and a first power source Vpix1 may be applied to both one end of the calibration transistor CAL and one end of the second source follower transistor SF2.

As exemplarily shown in FIGS. 3 and 4, the semiconductor substrate 110 may include a first surface 110F1 and a second surface 110F2, which are opposite to each other. In an example embodiment of the present inventive concept, the semiconductor substrate 110 may include a P-type semiconductor substrate. For example, the semiconductor substrate 110 may include a P-type silicon (Si) substrate. In an example embodiment of the present inventive concept, the semiconductor substrate 110 may include a P-type bulk silicon (Si) substrate and a P-type or N-type epitaxial layer grown on the P-type bulk silicon (Si) substrate. In an example embodiment of the present inventive concept, the semiconductor substrate 110 may include an N-type bulk silicon (Si) substrate and a P-type or N-type epitaxial layer grown thereon. Alternatively, the semiconductor substrate 110 may include an organic plastic substrate.

A plurality of pixels PX may be arranged in a matrix form in the semiconductor substrate 110. A plurality of photoelectric conversion regions PD may be respectively in the plurality of pixels PX. Each of the plurality of photoelectric conversion regions PD may include a photodiode region and a well region.

The pixel device isolation film 130 may be in the semiconductor substrate 110, and the plurality of pixels PX may be defined by the pixel device isolation film 130. For example, the pixel device isolation film 130 may be formed to surround each of the plurality of pixels PX. The pixel device isolation film 130 may be between one of the plurality of photoelectric conversion regions PD and the photoelectric conversion region PD adjacent thereto. One photoelectric conversion region PD may be physically and electrically isolated from another photoelectric conversion region PD adjacent thereto by the pixel device isolation film 130. The pixel device isolation film 130 may be between the respective ones of the plurality of photoelectric conversion regions PD, which are arranged in a matrix form. The pixel device isolation film 130 may have a grid or mesh shape in a view from above.

The pixel device isolation film 130 may be formed inside a pixel trench 130T, which passes through the semiconductor substrate 110 from the first surface 110F1 of the semiconductor substrate 110 to the second surface 110F2 thereof. The pixel device isolation film 130 may include an insulating layer 132 conformally formed on a sidewall of the pixel trench 130T and a conductive layer 134 formed on the insulating layer 132 to fill the inside of the pixel trench 130T. In an example embodiment of the present inventive concept, the insulating layer 132 may include a metal oxide such as, for example, hafnium oxide ($HfO_2$), aluminum oxide ($Al_2O_3$), and/or tantalum oxide ($Ta_2O_5$). In this case, the insulating layer 132 may serve as a negative fixed charge layer, but the present inventive concept is not limited thereto. In an example embodiment of the present inventive concept, the insulating layer 132 may include an insulating material such as, for example, silicon oxide ($SiO_2$), silicon nitride ($Si_3N_4$), and/or silicon oxynitride (SiON). The conductive layer 134 may include at least one of, for example, doped polysilicon (p-Si), a metal, a metal silicide, a metal nitride, or a metal-containing film.

In an example embodiment of the present inventive concept, an upper insulating film 136 may be in a portion of the pixel trench 130T, which is adjacent to the first surface 110F1 of the semiconductor substrate 110. In an example embodiment of the present inventive concept, the formation of the upper insulating film 136 may include etching back portions of the insulating layer 132 and the conductive layer 134, which are at an entrance of the pixel trench 130T, and filling the remaining space of the pixel trench 130T with an insulating material. For example, the pixel device isolation film 130 may have a structure configured to refract incident light obliquely incident on the photoelectric conversion region PD. Also, the pixel device isolation film 130 may limit or prevent the migration of photocharges generated in one pixel during light exposure to the neighboring pixels to enhance the image quality.

FIG. 4 illustrates an example in which the pixel device isolation film 130 extends from the first surface 110F1 of the semiconductor substrate 110 to the second surface 110F2 thereof and passes through the semiconductor substrate 110. In another case, however, the pixel device isolation film 130 may extend from the second surface 110F2 of the semiconductor substrate 110 into the semiconductor substrate 110 and may not be exposed at the first surface 110F1 of the semiconductor substrate 110.

As exemplarily shown in FIG. 4, the device isolation film STI defining the first to fourth active regions ACT1 to ACT4 may be formed in the semiconductor substrate 110 at the first surface 110F1. The device isolation film STI may be in a device isolation trench (refer to 110T in FIG. 14), which is formed to have a predetermined depth from the first surface 110F1 of the semiconductor substrate 110. For example, a depth at which the device isolation film STI is formed may be shallower than a depth at which the pixel device isolation film 130 is formed. The device isolation film STI may include an insulating material. The device isolation film STI may surround an upper sidewall of the pixel device isolation film 130 (e.g., a sidewall of the upper insulating film 136).

Transistors constituting pixel circuits may be on the first to fourth active regions ACT1 to ACT4. The sources, drains and channels of these transistors may be formed in the first to fourth active regions ACT1 to ACT4 of the semiconductor substrate 110. For example, as exemplarily shown in FIG. 2, the transfer gate electrode 140, the DCG gate electrode 151, the reset gate electrode 152, the pre-charge gate electrode 153, the sample gate electrode 154, the calibration gate electrode 155, the first and second selection gate electrodes 156 and 157, and the first and second source follower gate electrodes 158 and 159 may be on the first surface 110F1 of the semiconductor substrate 110. For example, the transistors constituting the pixel circuits may be disposed on the first surface 110F1 of the semiconductor substrate 110.

The first floating diffusion region FD1 may be in a portion of the first active region ACT1, for example, a portion of the first active region ACT1 adjacent to the transfer gate electrode 140.

As exemplarily shown in FIG. 4, the transfer gate electrode 140 may be in a transfer gate trench 140T, which extends from the first surface 110F1 of the semiconductor substrate 110 into the semiconductor substrate 110. The DCG gate electrode 151, the reset gate electrode 152, the pre-charge gate electrode 153, the sample gate electrode 154, the calibration gate electrode 155, the first and second selection gate electrodes 156 and 157, and the first and second source follower gate electrodes 158 and 159 may be collectively referred to as a planar gate electrode 150. The planar gate electrode 150 may be on the first surface 110F1 of the semiconductor substrate 110. In an example embodiment of the present inventive concept, the transfer gate electrode 140 and the planar gate electrode 150 may include at least one of, for example, doped polysilicon (p-Si), a metal, a metal silicide, a metal nitride, or a metal-containing film.

A transfer gate insulating layer 140I may be on an inner wall of the transfer gate trench 140T to surround a sidewall and a bottom surface of the transfer gate electrode 140. A transfer gate spacer 140S may be on a sidewall of the transfer gate electrode 140. A gate insulating layer 150I may be between the planar gate electrode 150 and the first surface 110F1 of the semiconductor substrate 110. A gate spacer 150S may be on a sidewall of the planar gate electrode 150.

A first interlayer insulating film 160 may be on the first surface 110F1 of the semiconductor substrate 110 to cover the transfer gate electrode 140 and the planar gate electrode 150. For example, the first interlayer insulating film 160 may be formed to cover the transistors constituting the pixel circuits. The first interlayer insulating film 160 may have a stack structure including a lower insulating layer 162 and an upper insulating layer 164 sequentially stacked on the first surface 110F1 of the semiconductor substrate 110. The lower insulating layer 162 may cover the transfer gate electrode 140 and the planar gate electrode 150 on the first surface 110F1 of the semiconductor substrate 110, and the upper insulating layer 164 may be on the lower insulating layer 162. A first wiring layer M1 may be on the lower insulating layer 162, and the upper insulating layer 164 may cover the first wiring layer M1. In an example embodiment of the present inventive concept, an etch stop layer may be formed between the lower insulating layer 162 and the first surface 110F1 of the semiconductor substrate 110. The etch stop layer may include a material having an etch selectivity with respect to that of the lower insulating layer 162.

The first capacitor C1 and the second capacitor C2 may be on the first interlayer insulating film 160. An upper pad electrode CUP may be shared by both the first capacitor C1 and the second capacitor C2.

As exemplarily shown in FIGS. 3 and 4, a first lower pad electrode LP1 and a second lower pad electrode LP2 may be spaced apart from each other on the first interlayer insulating film 160. The first lower pad electrode LP1 and the second lower pad electrode LP2 may be in parallel with the first surface 110F1 of the semiconductor substrate 110 in a central region of the pixel PX. For example, the first lower pad electrode LP1 and the second lower pad electrode LP2 may be formed at the same vertical level. The first and second lower pad electrodes LP1 and LP2 may occupy at least 50% of an area of the pixel PX (see FIG. 3). A mold insulating layer 170 may be formed on the first interlayer insulating film 160 to cover the first lower pad electrode LP1 and the second lower pad electrode LP2. The mold insulating layer 170 may include at least one of, for example, silicon oxide ($SiO_2$), silicon nitride ($Si_3N_4$), or silicon oxynitride (SiON).

A plurality of first lower electrodes LE1 may be respectively inside a plurality of first openings 170H1 (see FIGS. 7 and 17), which pass through the mold insulating layer 170 and expose a top surface of the first lower pad electrode LP1. A plurality of second lower electrodes LE2 may be respectively inside a plurality of second openings 170H2 (see FIGS. 7 and 17), which pass through the mold insulating layer 170 and expose a top surface of the second lower pad electrode LP2. As shown in FIG. 3, the first and second lower electrodes LE1 and LE2 may be arranged in a zigzag form along a first direction parallel to a top surface of the semiconductor substrate 110 and a second direction parallel to the top surface of the semiconductor substrate 110. The second direction may be perpendicular to the first direction. However, the present inventive concept is not limited thereto. Each of the first lower electrode LE1 and the second lower electrode LE2 may have a cylindrical shape.

A dielectric film DL and an upper electrode CUE may be sequentially formed on the first lower electrode LE1 and the second lower electrode LE2. The dielectric film DL may be conformally formed on top surfaces and inner walls of the first lower electrode LE1 and the second lower electrode LE2, which have cylindrical shapes. The upper electrode CUE may be formed on the dielectric film DL to fill the remaining space of the plurality of first openings 170H1 and the plurality of second openings 170H2. The first and second lower electrodes LE1 and LE2 and the upper electrode CUE may each include a film including a metal having a high melting point, such as, for example, cobalt (Co), titanium (Ti), nickel (Ni), tungsten (W) or molybdenum (Mo), and/or a metal nitride film, such as, for example, a titanium nitride film (TiN), a titanium silicon nitride film (TiSiN), a titanium aluminum nitride film (TiAlN), a tantalum nitride film (TaN), a tantalum silicon nitride film (TaSiN), a tantalum aluminum nitride film (TaAlN), or a tungsten nitride film (WN). The dielectric film DL may include one or a combination of single films selected from combinations of a metal oxide, such as, for example, hafnium oxide ($HfO_2$), zirconium oxide ($ZrO_2$), aluminum oxide ($Al_2O_3$), lanthanum oxide ($La_2O_3$), tantalum oxide ($Ta_2O_5$), or titanium oxide ($TiO_2$), and a dielectric material having a perovskite structure, such as, for example, strontium titanium oxide ($SrTiO_3$, STO), barium strontium titanium oxide (($Ba,Sr)TiO_3$, BST), barium titanium oxide ($BaTiO_3$), lead zirconate titanate ($Pb(Ti,Zr)O_3$, PZT), or lead lanthanum zirconium titanate (($Pb,La)(Zr,Ti)O_3$, PLZT).

An upper pad electrode CUP may be on the mold insulating layer 170 to cover an upper portion of the upper electrode CUE. The upper pad electrode CUP may vertically overlap the first and second lower pad electrodes LP1 and LP2. The upper pad electrode CUP may include a conductive material different from that of the upper electrode CUE, or may include a doped semiconductor material. The upper pad electrode CUP may include, for example, doped polysilicon (p-Si), silicon germanium (SiGe), and/or a metal, such as, for example, tungsten (W), copper (Cu), aluminum (Al), titanium (Ti), or tantalum (Ta).

A second wiring layer M2 may be spaced apart from the first and second lower pad electrodes LP1 and LP2 on the upper insulating layer 164 (see FIGS. 3 and 6). For example, the second wiring layer M2, the first lower pad electrode LP1 and the second lower pad electrode LP2 may be formed at the same vertical level. For example, the second wiring layer M2 may surround the first and second lower pad electrodes LP1 and LP2 in a view from above. Because the second wiring layer M2 is on an edge of the pixel PX to surround the first and second lower pad electrodes LP1 and LP2, the second wiring layer M2 may be referred to as an edge wiring layer.

The first capacitor C1 may include the first lower pad electrode LP1, the plurality of first lower electrodes LE1, the dielectric film DL, the upper electrode CUE, and the upper pad electrode CUP. The first lower pad electrode LP1 and the plurality of first lower electrodes LE1 may correspond to the first electrode C12, and the upper electrode CUE and the upper pad electrode CUP may correspond to the second electrode C14. The second capacitor C2 may include the second lower pad electrode LP2, the plurality of second lower electrodes LE2, the dielectric film DL, the upper electrode CUE, and the upper pad electrode CUP. The second lower pad electrode LP2 and the plurality of second lower electrodes LE2 may correspond to the third electrode C22, and the upper electrode CUE and the upper pad electrode CUP may correspond to the fourth electrode C24. For example, the upper electrode CUE and the upper pad electrode CUP may be shared by both the second electrode C14 of the first capacitor C1 and the fourth electrode C24 of the second capacitor C2. Because the first capacitor C1 and the second capacitor C2 respectively include the first and second lower electrodes LE1 and LE2 having cylindrical shapes, the capacitances of the first and second capacitors C1 and C2 may be increased, and the loss of charges and the generation of noise may be reduced during a global shutter operation, thereby enhancing shutter efficiency.

A second interlayer insulating film 172 may be on the mold insulating layer 170, and may have a stack structure including first to fourth insulating layers 172A, 172B, 172C, and 172D sequentially stacked on the mold insulating layer 170. For example, the first insulating layer 172A may be on the mold insulating layer 170 to cover the upper pad electrode CUP. A third wiring layer M3 may be on the first insulating layer 172A, and the second insulating layer 172B may be on the first insulating layer 172A to cover the third wiring layer M3. A fourth wiring layer M4 may be on the second insulating layer 172B, and the third insulating layer 172C may be on the second insulating layer 172B to cover the fourth wiring layer M4. A fifth wiring layer M5 may be on the third insulating layer 172C, and the fourth insulating layer 172D may be on the third insulating layer 172C to cover the fifth wiring layer M5.

The first to fifth wiring layers M1, M2, M3, M4, and M5 may include at least one of, for example, doped or undoped polysilicon (p-Si), a metal, a metal silicide, a metal nitride, or a metal-containing film. For example, the first to fifth wiring layers M1, M2, M3, M4, and M5 may each include, for example, tungsten (W), aluminum (Al), copper (Cu), tungsten silicide ($WSi_2$), titanium silicide ($TiSi_2$), tungsten nitride (WN), titanium nitride (TiN), and/or doped polysilicon (p-Si). The first to fourth insulating layers 172A, 172B, 172C, and 172D may each include an insulating material, such as, for example, silicon oxide ($SiO_2$), silicon nitride ($Si_3N_4$), or silicon oxynitride (SiON).

A first lower contact plug LCP1 may pass through the lower insulating layer 162 of the first interlayer insulating film 160 and be connected to the first wiring layer M1. The first lower contact plug LCP1 may be electrically connected to the first wiring layer M1 and an impurity region (a source/drain region) of a transistor located within one of the first to fourth active regions AC1 to AC4. A second lower contact plug LCP2 (see FIG. 6) may pass through the upper insulating layer 164 of the first interlayer insulating film 160 and be connected to the second wiring layer M2 and the first wiring layer M1. A first upper contact plug UCP1 may be on the upper pad electrode CUP to pass through the first insulating layer 172A, and the first upper contact plug UCP1 may be electrically connected to the third wiring layer M3 and the upper pad electrode CUP. In addition, a second upper contact plug UCP2 may pass through the second insulating layer 172B and connect the third wiring layer M3 to the fourth wiring layer M4. A third upper contact plug UCP3 may pass through the third insulating layer 172C and connect the fourth wiring layer M4 to the fifth wiring layer M5. A third contact plug CP3 (see FIG. 6) may pass through the mold insulating layer 170 and the first insulating layer 172A and electrically connect the second wiring layer M2 (or the edge wiring layer) to the third wiring layer M3.

As exemplarily shown in FIG. 3, the first lower pad electrode LP1 may include a main pad portion MP1 and an extension EX1 protruding from the main pad portion MP1. The main pad portion MP1 may have a rectangular horizontal cross-section. The second lower pad electrode LP2 may include a main pad portion MP2 and an extension EX2 protruding from the main pad portion MP2. The main pad portion MP2 may have a rectangular horizontal cross-section.

In an example embodiment of the present inventive concept, a first contact plug CP1 may be on a top surface of the extension EX1 of the first lower pad electrode LP1 (see FIGS. 3 and 5). The first contact plug CP1 may pass through the mold insulating layer 170 and the second interlayer insulating film 172 (e.g., the first insulating layer 172A of the second interlayer insulating film 172) and be connected to the third wiring layer M3. The first contact plug CP1 may be electrically connected to the third wiring layer M3 and the first lower pad electrode LP1. A bottom surface of the first lower pad electrode LP1 may be entirely covered by the first interlayer insulating film 160. For example, the bottom surface of the first lower pad electrode LP1 may be entirely in contact with the first interlayer insulating film 160.

A second contact plug CP2 may be on a top surface of the extension EX2 of the second lower pad electrode LP2 (see FIGS. 3 and 6). The second contact plug CP2 may pass through the mold insulating layer 170 and the second interlayer insulating film 172 (e.g., the first insulating layer 172A of the second interlayer insulating film 172) and be connected to the third wiring layer M3. The second contact plug CP2 may be electrically connected to the third wiring layer M3 and the second lower pad electrode LP2. A bottom surface of the second lower pad electrode LP2 may be entirely covered by the first interlayer insulating film 160. For example, the bottom surface of the second lower pad electrode LP2 may be entirely in contact with the first interlayer insulating film 160. For example, the first wiring layer M1 may be located at a vertical level lower than that of the first and second lower pad electrodes LP1 and LP2, and the third wiring layer M3 may be located at a vertical level higher than that of the first and second lower pad electrodes LP1 and LP2. The second lower pad electrode LP2 is not directly connected to the first wiring layer M1 through the second contact plug CP2 or any other contact plug, and the second lower pad electrode LP2 is connected to the third wiring layer M3 through the second contact plug CP2.

As shown in FIG. 6, the second lower pad electrode LP2 may be connected to the third wiring layer M3 through the second contact plug CP2 located on the top surface of the extension EX2 and be connected to an impurity region N+ of the calibration transistor CAL through the third contact plug CP3 connected to the third wiring layer M3, the second wiring layer M2, the second lower contact plug LCP2, the first wiring layer M1, and the first lower contact plug LCP1. That is, as shown in FIG. 6, the second lower pad electrode LP2 may be connected to the impurity region N+ of the calibration transistor CAL along a bypass electrical path C2_DP.

Since the second lower pad electrode LP2 may be electrically connected to the impurity region N+ of the calibration transistor CAL along the bypass electrical path C2_DP, which is formed by the second contact plug CP2, the third wiring layer M3, the third contact plug CP3, the second wiring layer M2, the second lower contact plug LCP2, the first wiring layer M1, and the first lower contact plug LCP1, damage may be prevented from being built up in the semiconductor substrate 110 due to plasma used in a process of forming the first capacitor C1 and the second capacitor C2. Because the second contact plug CP2 is formed after the process of forming the first capacitor C1 and the second capacitor C2, the first capacitor C1 and the second capacitor C2 may not be electrically connected to the impurity region N+ of the calibration transistor CAL during the process of forming the first capacitor C1 and the second capacitor C2.

As shown in FIG. 4, a rear insulating layer 182 may be formed on the second surface 110F2 of the semiconductor substrate 110. For example, the rear insulating layer 182 may be on substantially the entire area of the second surface 110F2 of the semiconductor substrate 110. The rear insulating layer 182 may be in contact with a top surface of the pixel device isolation film 130 at a level the same as that of the second surface 110F2 of the semiconductor substrate 110. In an example embodiment of the present inventive concept, the rear insulating layer 182 may include a metal oxide, such as, for example, hafnium oxide ($HfO_2$), aluminum oxide ($Al_2O_3$), and/or tantalum oxide ($Ta_2O_5$). In an example embodiment of the present inventive concept, the rear insulating layer 182 may include an insulating material, such as, for example, silicon oxide ($SiO_2$), silicon nitride ($Si_3N_4$), silicon oxynitride (SiON), and/or a low-k dielectric material.

A passivation layer 184 may be on the rear insulating layer 182, and a color filter 186 and a microlens 188 may be on the passivation layer 184. Light may be incident on the second surface 110F2 of the semiconductor substrate 110 through the microlens 188, the color filter 186, the passivation layer 184 and the rear insulating layer 182. Optionally, a support substrate may be further located on the first surface 110F1 of the semiconductor substrate 110.

According to the above-described example embodiments of the present inventive concept, the image sensor 100 may be a global-shutter-type image sensor having an increased capacitance, and shutter efficiency may be increased during a global shutter operation. For example, the capacitances of the first and second capacitors C1 and C2 may be increased when the first capacitor C1 and the second capacitor C2 respectively include the first and second lower electrodes LE1 and LE2 having cylindrical shapes. In addition, because the second lower pad electrode LP2 is connected to a storage node (e.g., the impurity region N+ of the calibration transistor CAL) along the bypass electrical path C2_DP, plasma damage may be prevented from being built up in the storage node of the semiconductor substrate 110 during the process of forming the first and second capacitors C1 and C2. For example, the bypass electrical path C2_DP may be formed after the process of forming the first and second capacitors C1 and C2. Accordingly, white spots may be prevented from occurring due to a junction leakage current, and thus, the image sensor 100 may be prevented from causing noise.

Figure 9:
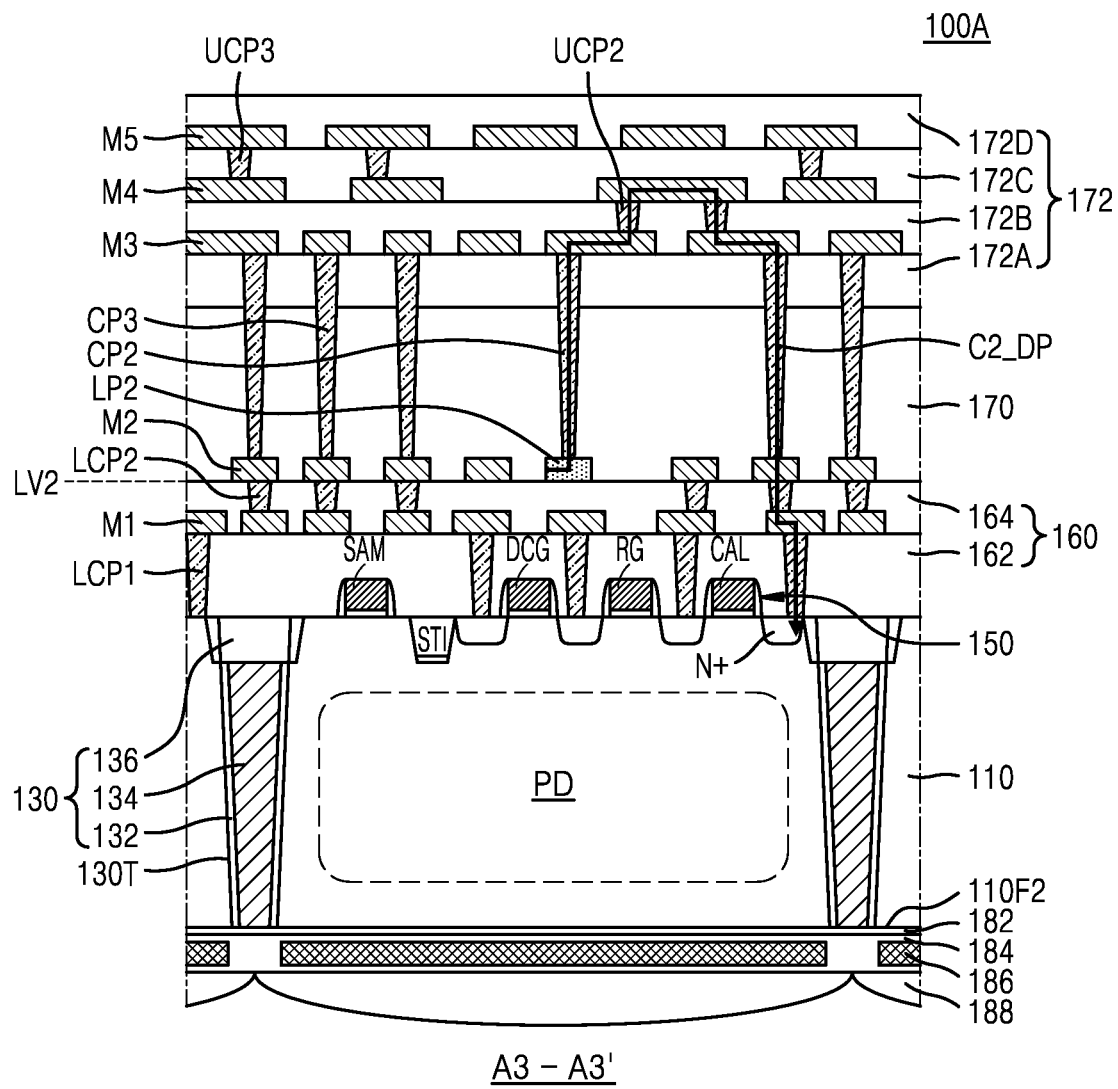
FIG. 9 is a cross-sectional view of an image sensor according to an example embodiment of the present inventive concept.

FIG. 9 is a cross-sectional view of an image sensor 100A according to an example embodiment of the present inventive concept. In FIG. 9, the same reference numerals are used to denote the same elements as in FIGS. 1 to 8.

Referring to FIG. 9, a second lower pad electrode LP2 may be connected to one of third wiring layers M3 through a second contact plug CP2 located on a top surface of an extension EX2, and may be electrically connected to an impurity region N+ of a calibration transistor CAL through a second upper contact plug UCP2 connected to the third wiring layer M3, a fourth wiring layer M4 connected to the second upper contact plug UCP2, an other second upper contact plug UCP2 connected to the fourth wiring layer M4, an other third wiring layer M3 connected to the other second upper contact plug UCP2, a third contact plug CP3 connected to the other third wiring layer M3, a second wiring layer M2 (or an edge wiring layer) connected to the third contact plug CP3, a second lower contact plug LCP2 connected to the second wiring layer M2, and a first wiring layer M1 and a first lower contact plug LCP1, which are connected to the second lower contact plug LCP2. That is, as shown in FIG. 9, the second lower pad electrode LP2 may be connected to the impurity region N+ of the calibration transistor CAL along a bypass electrical path C2_DP. The bypass electrical path C2_DP of FIG. 9 adds two second upper contact plugs UCP2 and the fourth wiring layer M4 to connect two separated third wiring layers in the path in comparison to the bypass electrical path C2_DP of FIG. 6.

Since the second lower pad electrode LP2 may be connected to the impurity region N+ of the calibration transistor CAL along the bypass electrical path C2_DP, which is formed by the second contact plug CP2, the third wiring layer M3, the second upper contact plug UCP2, the fourth wiring layer M4, the third contact plug CP3, the second wiring layer M2, the second lower contact plug LCP2, the first wiring layer M1, and the first lower contact plug LCP1, damage may be prevented from being built up in a semiconductor substrate 110 due to plasma used in a process of forming a first capacitor C1 and a second capacitor C2. For example, the bypass electrical path C2_DP of FIG. 9 may be formed after the process of forming the first and second capacitors C1 and C2. Accordingly, plasma damage may be prevented from being built up in the semiconductor substrate 110, especially, in an impurity region N+ of a calibration transistor CAL during the process of forming the first capacitor C1 and the second capacitor C2.

Figure 10:
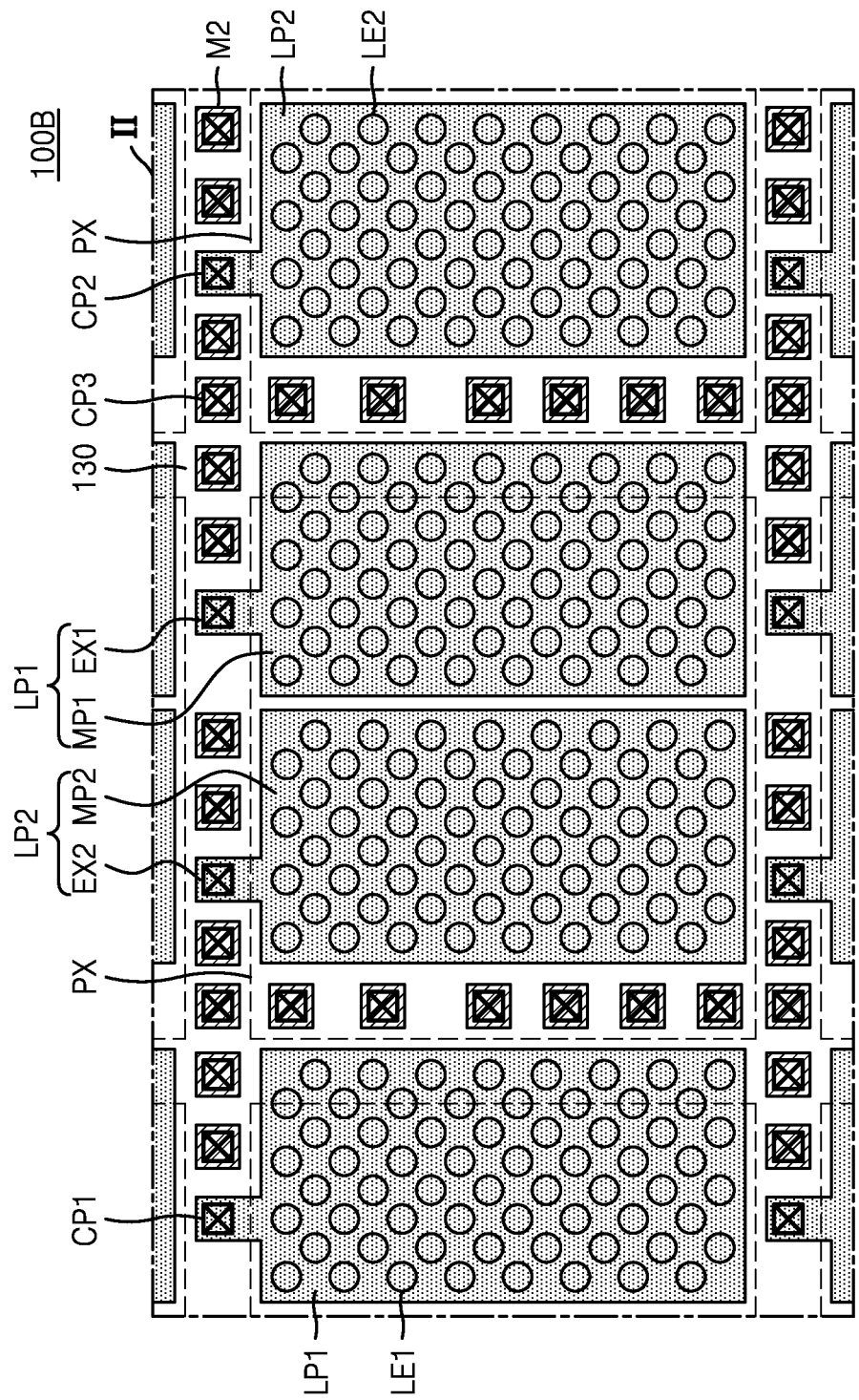
FIG. 10 is a layout diagram of an image sensor according to an example embodiment of the present inventive concept.

FIG. 10 is a diagram illustrating the layout of an image sensor 100B according to an example embodiment of the present inventive concept. In FIG. 10, the same reference numerals are used to denote the same elements as in FIGS. 1 to 9.

Referring to FIG. 10, a first lower pad electrode LP1 may include a main pad portion MP1 having a rectangular shape with a long side and a short side and an extension EX1 that protrudes outward from the short side of the main pad portion MP1. A second lower pad electrode LP2 may include a main pad portion MP2 having a rectangular shape with a long side and a short side and an extension EX2 that protrudes outward from the short side of the main pad portion MP2. For example, the extension EX1 of the first lower pad electrode LP1 and the extension EX2 of the second lower pad electrode LP2 may be at positions vertically overlapping a pixel device isolation film 130. The second lower pad electrode LP2 described here with reference to FIG. 10 is different from the second lower pad electrode LP2 illustrated in FIG. 3. In FIG. 3, the extension EX2 of the second lower pad electrode LP2 protrudes outward from the long side of the main pad portion MP2.

FIG. 10 illustrates an example in which the extension EX1 of the first lower pad electrode LP1 and the extension EX2 of the second lower pad electrode LP2, which are included in one pixel PX, protrude in the same direction. In another case, however, the extension EX1 of the first lower pad electrode LP1 may protrude in an upward direction of FIG. 10, and the extension EX2 of the second lower pad electrode LP2 may protrude in a downward direction of FIG. 10.

Figure 11:
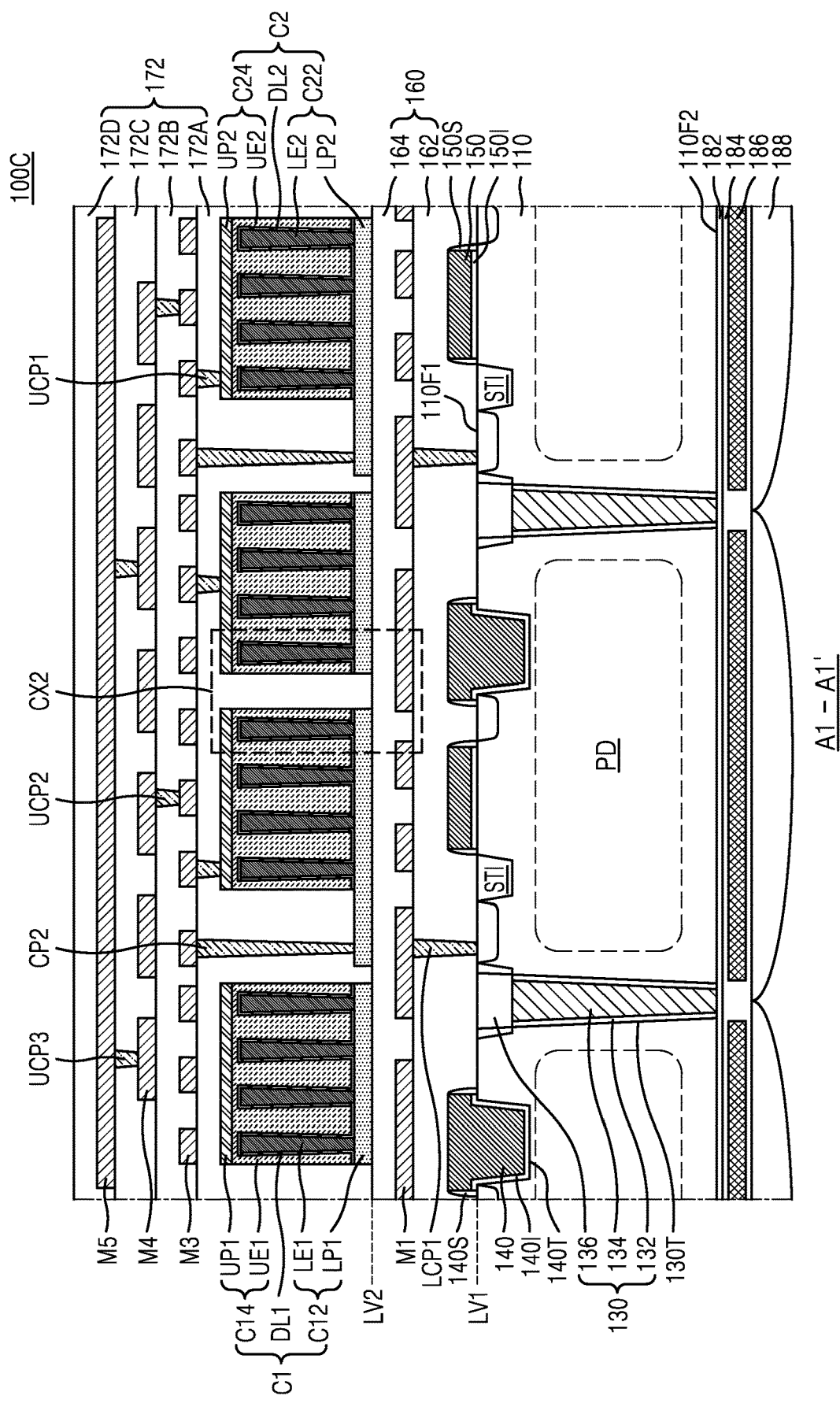
FIG. 11 is a cross-sectional view of an image sensor according to an example embodiment of the present inventive concept.
Figure 12:
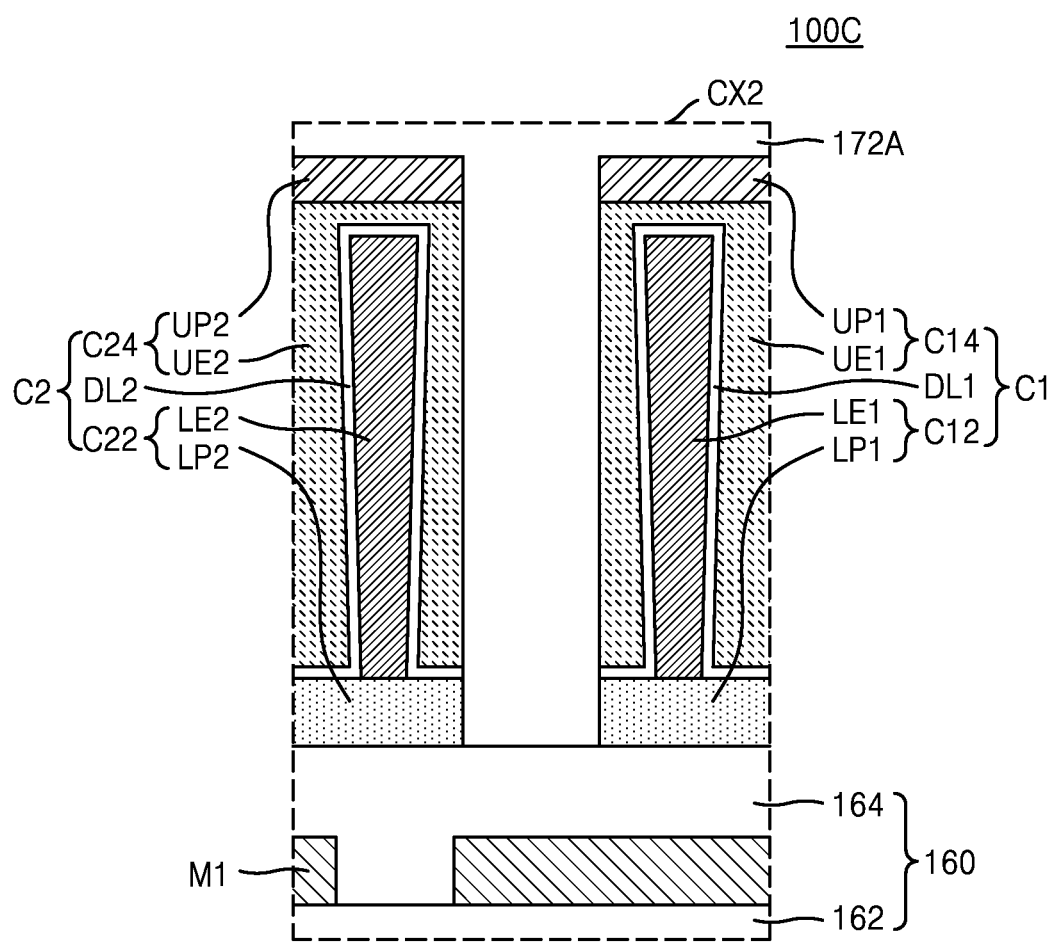
FIG. 12 is an enlarged view of region CX2 of FIG. 11.

FIG. 11 is a cross-sectional view of an image sensor 100C according to an example embodiment of the present inventive concept, and FIG. 12 is an enlarged view of region CX2 of FIG. 11. In FIGS. 11 and 12, the same reference numerals are used to denote the same elements as in FIGS. 1 to 10.

Referring to FIGS. 11 and 12, the first capacitor C1 may include a first lower pad electrode LP1, a plurality of first lower electrodes LE1, a first dielectric film DL1, a first upper electrode UE1, and a first upper pad electrode UP1, and the second capacitor C2 may include a second lower pad electrode LP2, a plurality of second lower electrodes LE2, a second dielectric film DL2, a second upper electrode UE2, and a second upper pad electrode UP2.

Each of the plurality of first lower electrodes LE1 may have a pillar shape and extend in a vertical direction, and the first dielectric film DL1 may conformally cover a top surface and a sidewall of each of the plurality of first lower electrodes LE1. The first upper electrode UE1 may cover all of the plurality of first lower electrodes LE1 on the first dielectric film DL1. The first upper pad electrode UP1 may be in a flat plate shape on a top surface of the first upper electrode UE1. The first upper electrode UE1 and the first upper pad electrode UP1 may correspond to the second electrode C14 of the first capacitor C1.

Each of the plurality of second lower electrodes LE2 may have a pillar shape and extend in the vertical direction, and the second dielectric film DL2 may conformally cover a top surface and a sidewall of each of the second lower electrodes LE2. The second upper electrode UE2 may cover all of the plurality of second lower electrodes LE2 on the second dielectric film DL2. The second upper pad electrode UP2 may be in a flat plate shape on a top surface of the second upper electrode UE2. The second upper electrode UE2 and the second upper pad electrode UP2 may correspond to the fourth electrode C24 of the second capacitor C2. Although the first upper pad electrode UP1 and the second upper pad electrode UP2 are spaced apart from each other, the first upper pad electrode UP1 and the second upper pad electrode UP2 may be connected to the same node (e.g., the first node X shown in FIG. 8) each by a first upper contact plug UCP1. For example, the second electrode C14 of the first capacitor C1 and the fourth electrode C24 of the second capacitor C2 may be connected to the same node (e.g., the first node X shown in FIG. 8).

A mold insulating layer (refer to 170 in FIG. 4) may be omitted from the image sensor 100C shown in FIGS. 11 and 12. The first capacitor C1 and the second capacitor C2 may be covered by a first insulating layer 172A of a second interlayer insulating film 172. A first contact plug (refer to CP1 in FIG. 5) and a second contact plug CP2 may pass through the first insulating layer 172A.

Figure 13:
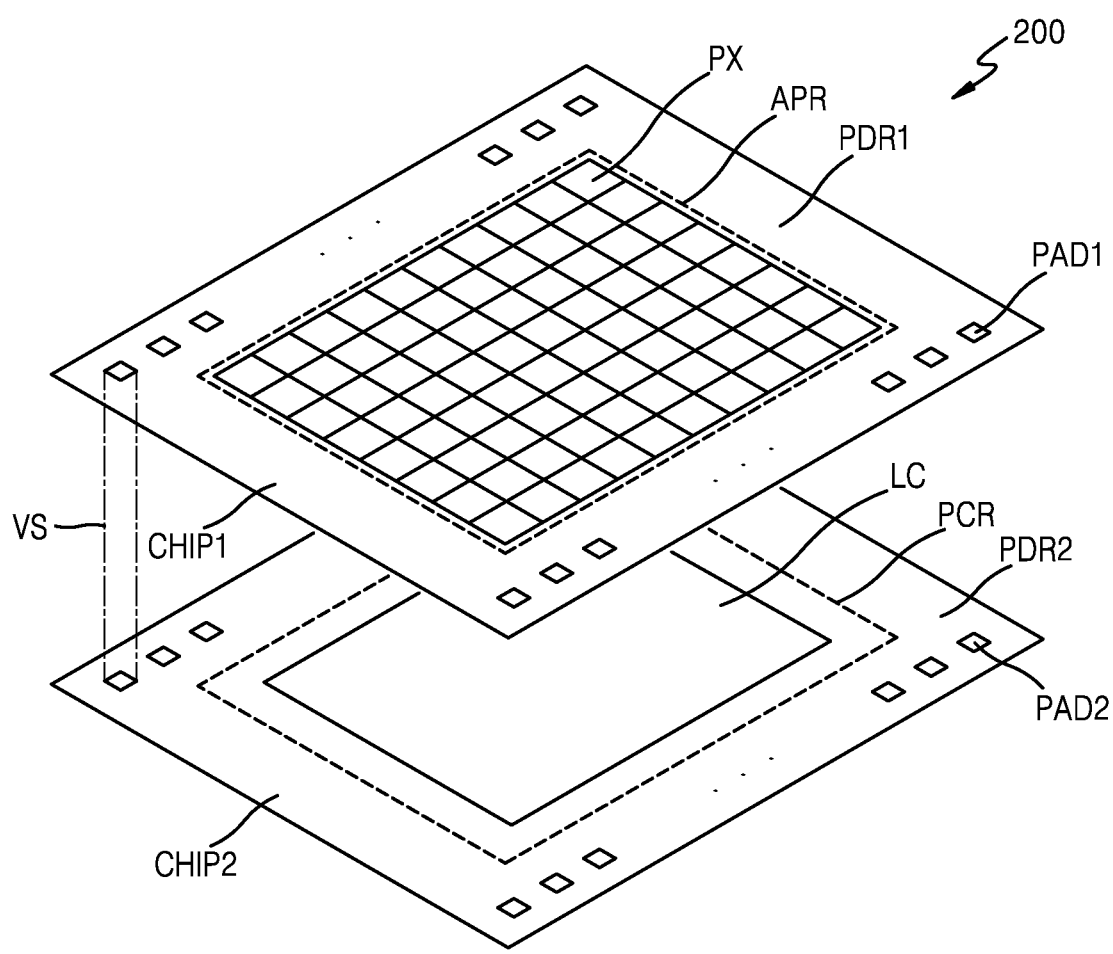
FIG. 13 is a schematic view of an image sensor according to an example embodiment of the present inventive concept.

FIG. 13 is a schematic view of an image sensor 200 according to an example embodiment of the present inventive concept.

Referring to FIG. 13, the image sensor 200 may be a stack-type image sensor including a first chip CHIP1 and a second chip CHIP2, in which the first chip CHIP1 may be stacked on the second chip CHIP2 in a vertical direction. The first chip CHIP1 may include an active pixel region APR and a first pad region PDR1, and the second chip CHIP2 may include a peripheral circuit region PCR and a second pad region PDR2.

A plurality of first pads PAD1 of the first pad region PDR1 may transmit and receive electric signals to and from an external device. The peripheral circuit region PCR may include a logic circuit block LC and a plurality of CMOS transistors. The peripheral circuit region PCR may provide a constant signal to each active pixel PX of the active pixel region APR or control an output signal of each active pixel PX. The first pads PAD1 of the first pad region PDR1 may be electrically connected to second pads PAD2 of the second pad region PDR2 by a via structure VS.

FIGS. 14 to 22 are cross-sectional views of a method of manufacturing an image sensor 100, according to an example embodiment of the present inventive concept. In FIGS. 14 to 22, the same reference numerals are used to denote the same elements as in FIGS. 1 to 13.

Figure 14:
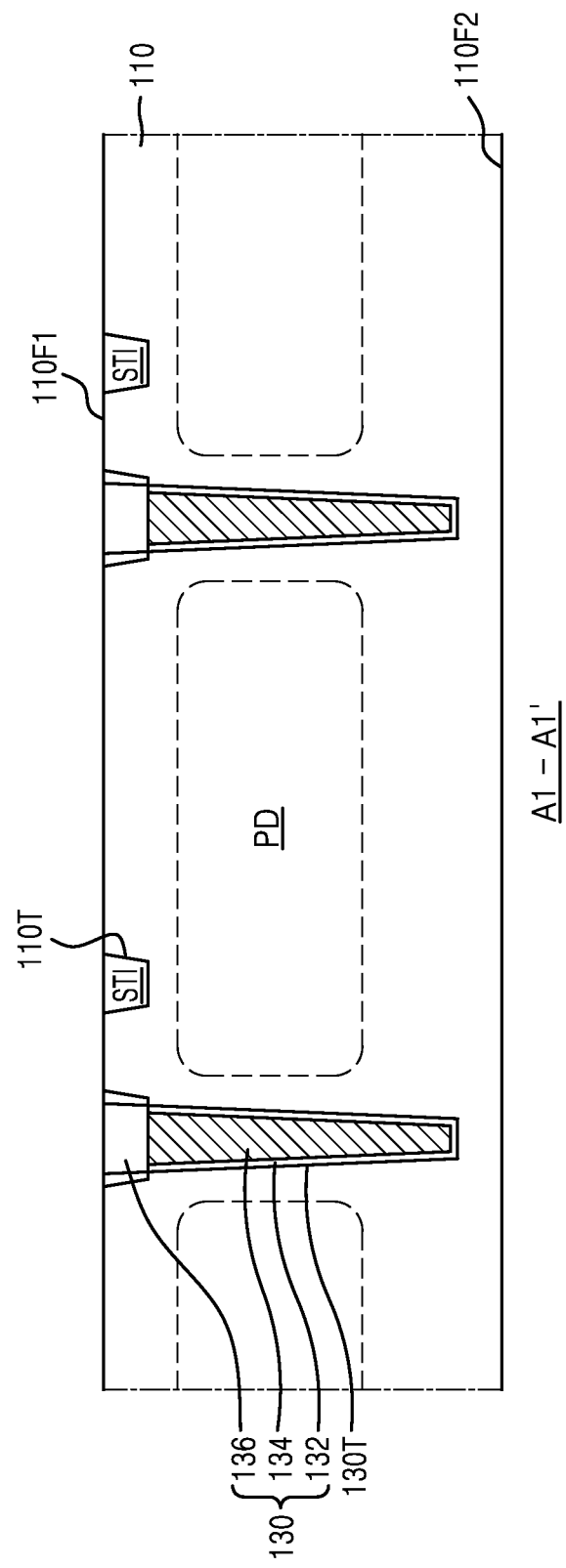
FIGS. 14 to 22 are cross-sectional views of a method of manufacturing an image sensor, according to an example embodiment of the present inventive concept.

Referring to FIG. 14, a semiconductor substrate 110 including a first surface 110F1 and a second surface 110F2, which are opposite each other, may be prepared. A photoelectric conversion region PD may be formed by performing an ion implantation process on the first surface 110F1 of the semiconductor substrate 110. Thus, the photoelectric conversion region PD may be formed in the semiconductor substrate 110. For example, a photoelectric conversion region PD may include a photodiode region and a well region. The photodiode region may be doped with N-type impurities, and the well region may be doped with P-type impurities.

Next, a first mask pattern may be formed on the first surface 110F1 of the semiconductor substrate 110, and a device isolation trench 110T may be formed in the semiconductor substrate 110 by using the first mask pattern as an etch mask. For example, the device isolation trench 110T may be formed by removing a portion of the semiconductor substrate 110 through an etching process.

Subsequently, the device isolation trench 110T may be filled with an insulating material, and thus, a device isolation film STI may be formed inside the device isolation trench 110T. The device isolation film STI may be formed to cover the first mask pattern.

Thereafter, a second mask pattern may be formed on the first surface 110F1 of the semiconductor substrate 110, and pixel trenches 130T may be formed in the semiconductor substrate 110 by using the second mask pattern as an etch mask. The pixel trenches 130T may have a predetermined depth from the first surface 110F1 of the semiconductor substrate 110 and be arranged in a matrix form in a view from above. For example, a depth of the pixel trenches 130T may be larger than a depth of the device isolation trench 110T.

An insulating layer 132 may be then conformally formed on the first surface 110F1 of the semiconductor substrate 110 and an inner wall of the pixel trench 130T by using a chemical vapor deposition (CVD) process or an atomic layer deposition (ALD) process. Thereafter, a conductive layer 134 may be formed on the insulating layer 132 to fill an inner wall of the pixel trench 130T.

A portion of the insulating layer 132 and a portion of the conductive layer 134 may be removed so that the first surface 110F1 of the semiconductor substrate 110 may be exposed. Afterwards, a portion of the insulating layer 132 and a portion of the conductive layer 134, which are in an upper portion of the pixel trench 130T, may be further removed using an etchback process, and a vacant space of the pixel trench 130T may be filled with an insulating material, and thus, an upper insulating film 136 may be formed on the insulating layer 132 and the conductive layer 134 in the upper portion of the pixel trench 130T.

Figure 15:
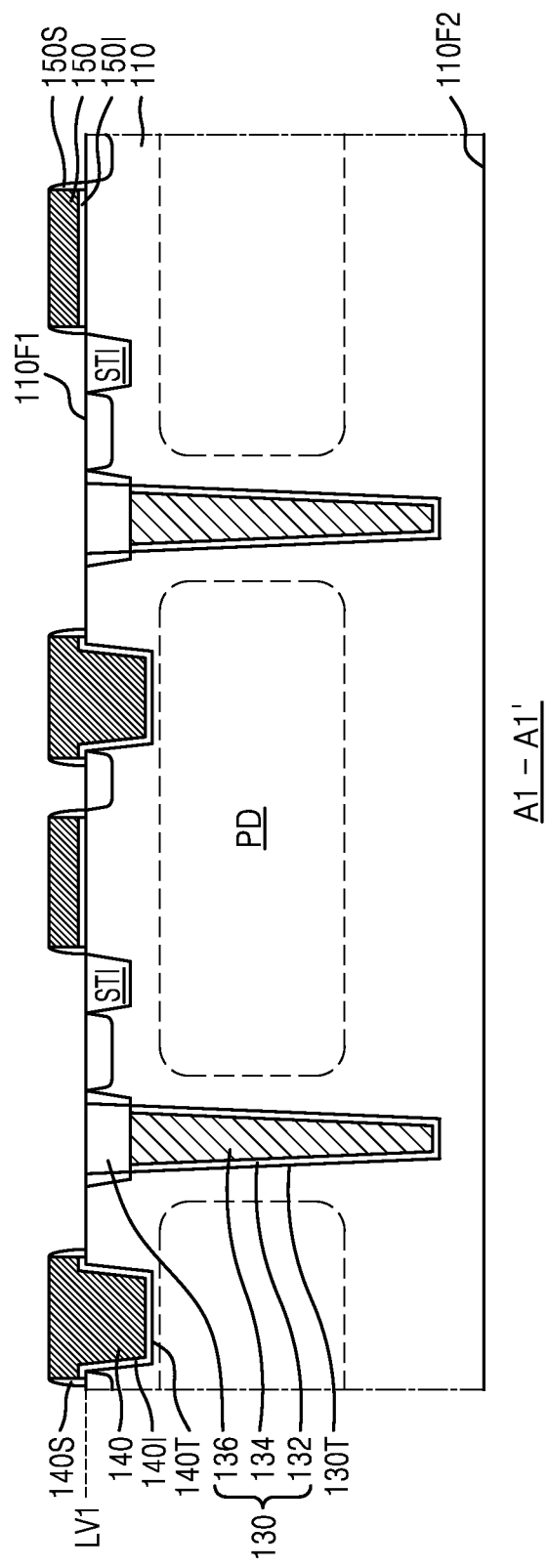

Referring to FIG. 15, a mask pattern may be formed on the first surface 110F1 of the semiconductor substrate 110, and a portion of the semiconductor substrate 110 may be removed using the mask pattern as an etch mask, thereby forming a transfer gate trench 140T.

A transfer gate electrode 140 and a planar gate electrode 150 may be formed on the first surface 110F1 of the semiconductor substrate 110 and an inner wall of the transfer gate trench 140T. In an example embodiment of the present inventive concept, before the transfer gate electrode 140 and the planar gate electrode 150 are formed, a transfer gate insulating layer 140I may be formed on the inner wall of the transfer gate trench 140T and a gate insulating layer 150I may be formed on the first surface 110F1 under the planar gate electrode 150. Next, a transfer gate spacer 140S and a gate spacer 150S may be further respectively formed on a sidewall of the transfer gate electrode 140 and a sidewall of the planar gate electrode 150.

Afterwards, an ion implantation process may be performed on a partial region of the first surface 110F1 of the semiconductor substrate 110, thereby forming an impurity region in the semiconductor substrate 110.

Figure 16:
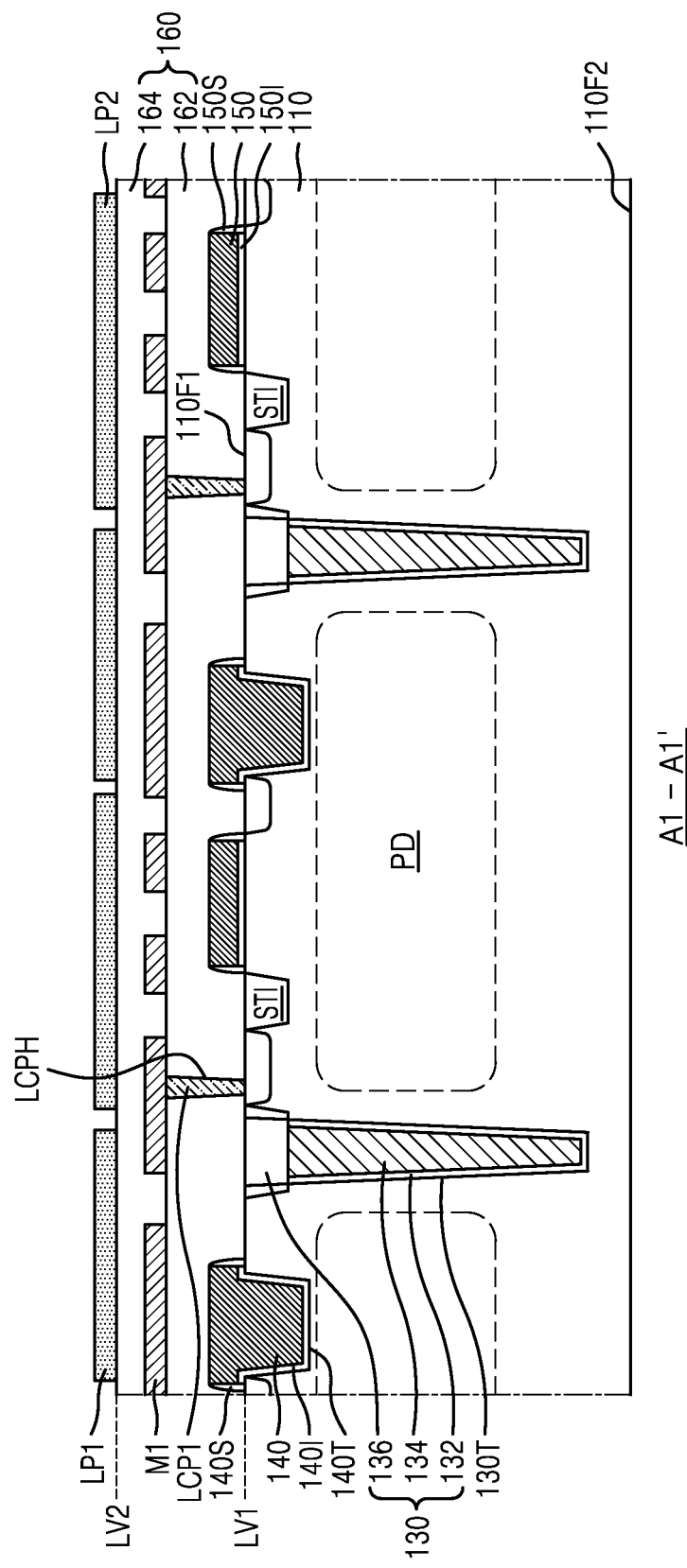

Referring to FIG. 16, a lower insulating layer 162 may be formed on the first surface 110F1 of the semiconductor substrate 110, and a first lower contact hole LCPH may be formed to pass through the lower insulating layer 162. Afterwards, the first lower contact hole LCPH may be filled with a conductive material to form a first lower contact plug LCP1. A first wiring layer M1 may be formed on the lower insulating layer 162, and an upper insulating layer 164 may be formed on the lower insulating layer 162 to cover the first wiring layer M1. Thereafter, a second lower contact hole may be formed to pass through the upper insulating layer 164. The second lower contact hole may be filled with a conductive material to form a second lower contact plug (refer to LCP2 in FIG. 6).

Subsequently, a conductive layer may be formed on the upper insulating layer 164 and patterned to form a first lower pad electrode LP1, a second lower pad electrode LP2, and a second wiring layer M2 (see FIG. 6). The first lower pad electrode LP1, the second lower pad electrode LP2, and the second wiring layer M2 may be formed using the same material. For example, the second wiring layer M2 (or an edge wiring layer) may be disposed on the second lower contact plug (refer to LCP2 in FIG. 6) and located at a vertical level the same as that of the first and second lower pad electrodes LP1 and LP2. The second lower pad electrode LP2 may not be in direct contact with the second lower contact plug (refer to LCP2 in FIG. 6). As shown in FIG. 3, in a view from above, the first lower pad electrode LP1 may include a main pad portion MP1 and an extension EX1, and the second lower pad electrode LP2 may include a main pad portion MP2 and an extension EX2.

Figure 17:
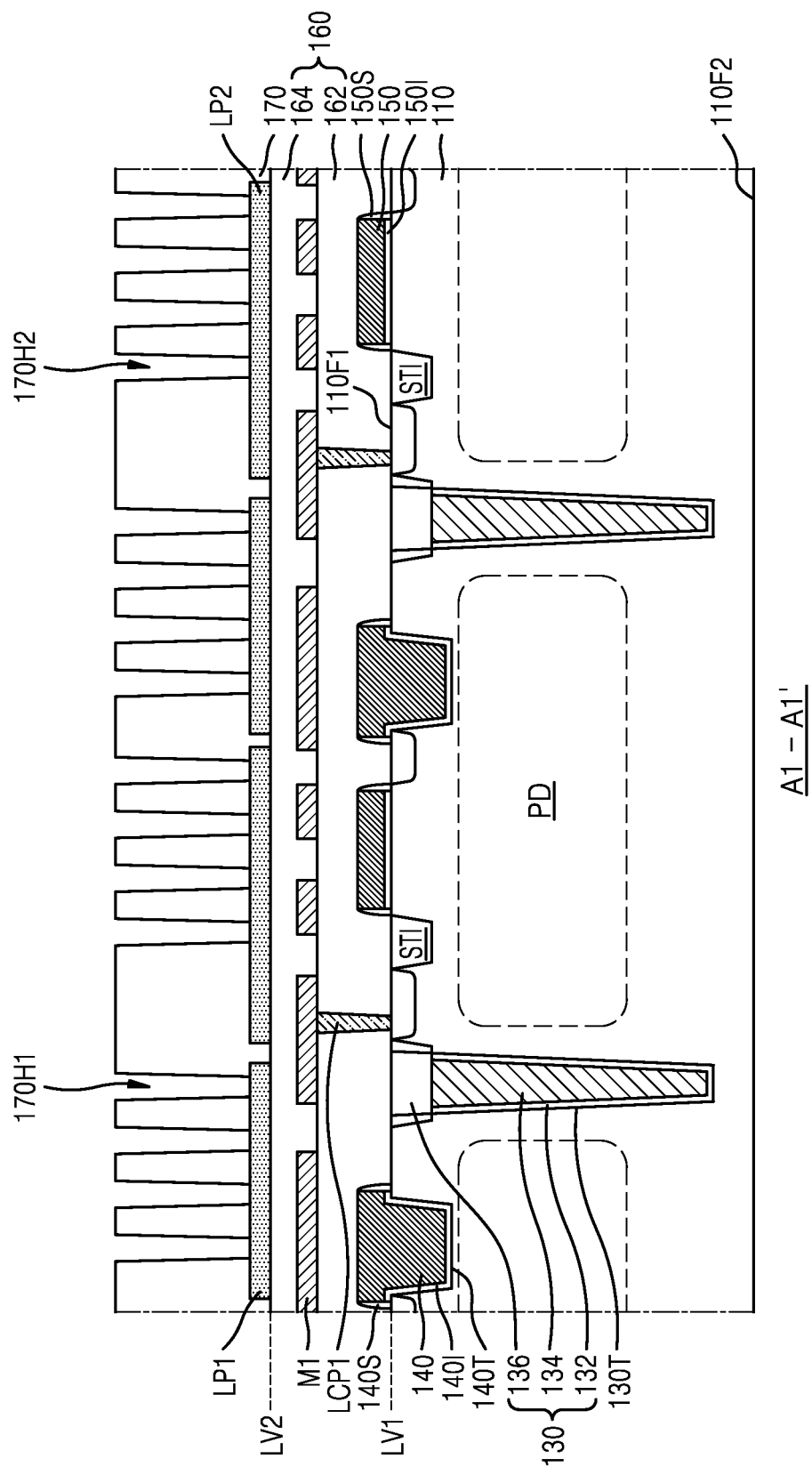

Referring to FIG. 17, a mold insulating layer 170 may be formed on the first interlayer insulating film 160. Next, a mask pattern may be formed on the mold insulating layer 170, and a plurality of first openings 170H1 and a plurality of second openings 170H2 may be formed in the mold insulating layer 170 using the mask pattern as an etch mask. The first lower pad electrode LP1 may be exposed at bottom portions of the plurality of first openings 170H1, and the second lower pad electrode LP2 may be exposed at bottom portions of the plurality of second openings 170H2.

Figure 18:
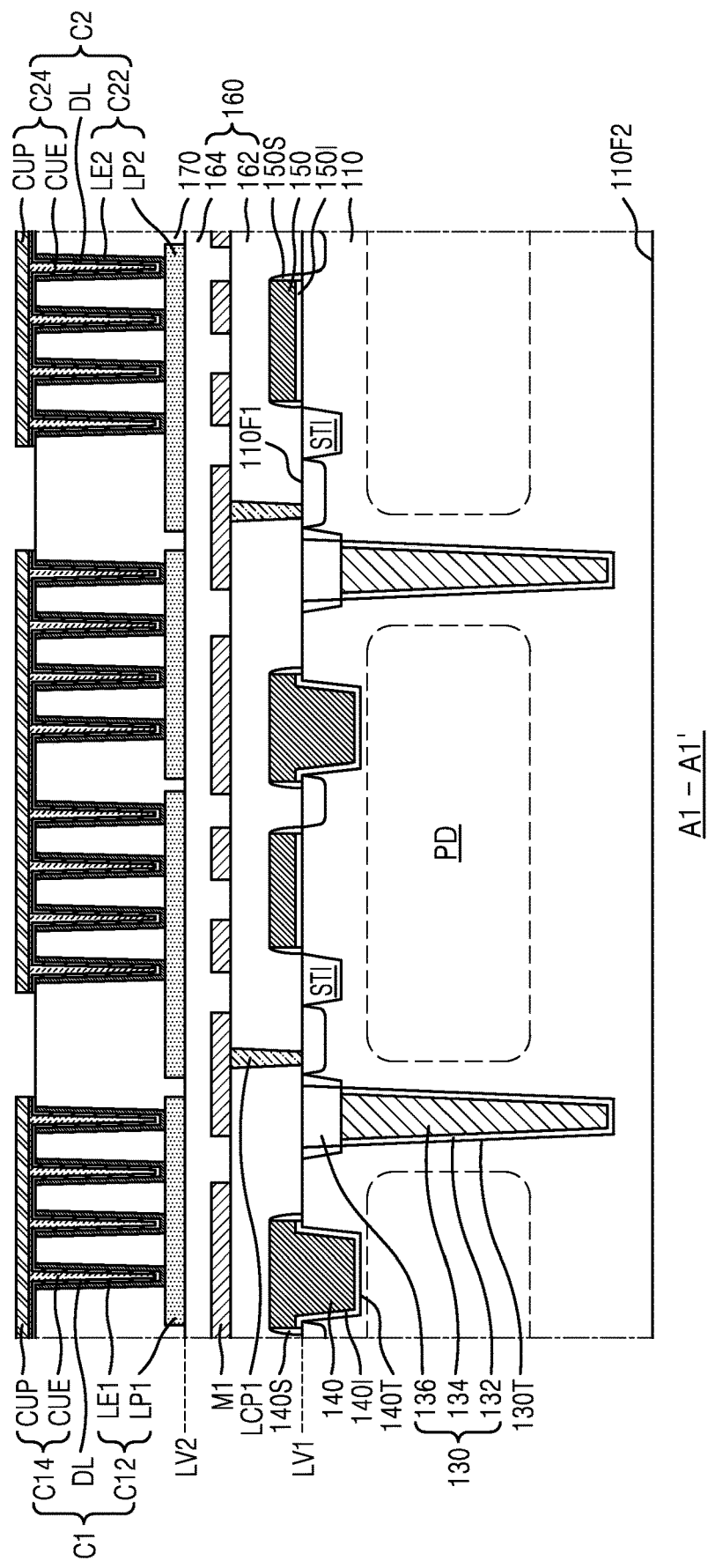

Referring to FIG. 18, a preliminary lower electrode layer may be formed on the mold insulating layer 170 to conformally cover inner walls of the plurality of first openings 170H1 and inner walls of the plurality of second openings 170H2. Portions of the preliminary lower electrode layer covering a top surface of the mold insulating layer 170 may be removed, and thus, a plurality of first lower electrodes LE1 may be formed on the inner walls of the plurality of first openings 170H1 and a plurality of second lower electrodes LE2 may be formed on the inner walls of the plurality of second openings 170H2. Each of the first lower electrode LE1 and the second lower electrode LE2 may have a cylindrical shape.

A dielectric film DL and an upper electrode CUE may be formed on the mold insulating layer 170 to conformally cover the inner walls of the plurality of first openings 170H1 and the inner walls of the plurality of second openings 170H2. A first capacitor C1 and a second capacitor C2 may be formed by forming an upper pad electrode CUP on the upper electrode CUE. Since the first capacitor C1 and the second capacitor C2 respectively include the first and second lower electrodes LE1 and LE2 having cylindrical shapes, the capacitances of the first and second capacitors C1 and C2 may be increased. For example, the upper pad electrode CUP may include a semiconductor material (e.g., silicon germanium (SiGe)) doped with impurities. A process of implanting impurity ions into the upper pad electrode CUP may be performed during the process of forming the upper pad electrode CUP.

In an example embodiment of the present inventive concept, a plasma-related process may be used in the process of forming the first capacitor C1 and the second capacitor C2. For example, a plasma-based etching process may be used in a process of etching the mold insulating layer 170. Even when the plasma-based etching process is performed, because the first and second lower pad electrodes LP1 and LP2 remain electrically insulated from the semiconductor substrate 110, plasma damage may be prevented from being built up in the semiconductor substrate 110, especially, in an impurity region N+(refer to FIG. 6) of a calibration transistor CAL. For example, the first and second lower pad electrodes LP1 and LP2 may not be electrically connected to a storage node (or the impurity region N+ of a calibration transistor CAL) during the process of forming the first capacitor C1 and the second capacitor C2. Accordingly, plasma damage may be prevented from being built up in the storage node (or the impurity region N+ of the calibration transistor CAL).

Figure 19:
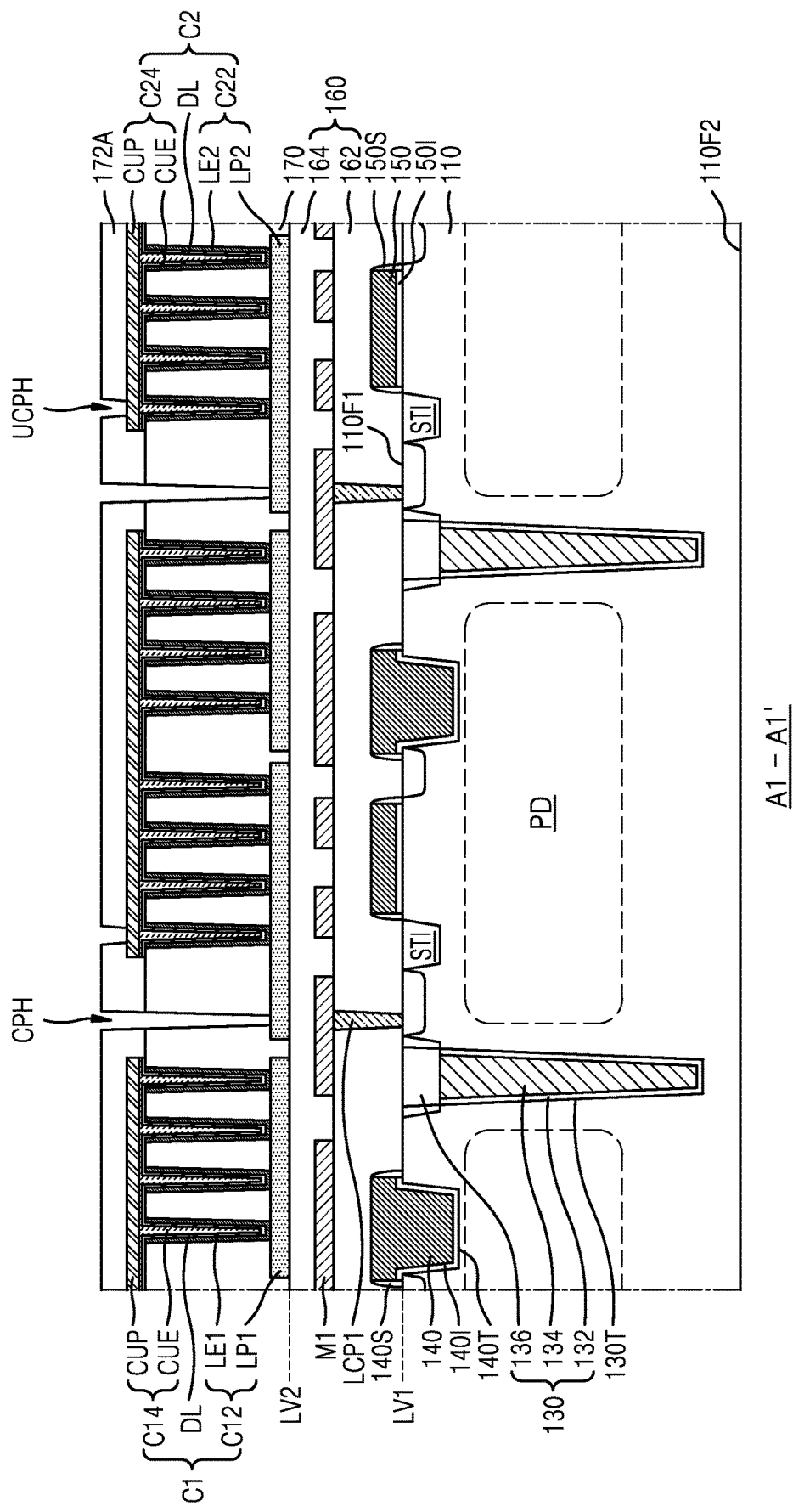

Referring to FIG. 19, a first insulating layer 172A may be formed on the mold insulating layer 170 and the upper pad electrode CUP. Subsequently, an upper contact hole UCPH passing through the first insulating layer 172A and a contact hole CPH passing through the first insulating layer 172A and the mold insulating layer 170 may be formed. For example, the contact hole CPH may expose a top surface of the second lower pad electrode LP2, a top surface of the first lower pad electrode LP1, and a top surface of a second wiring layer (refer to M2 in FIG. 6).

Figure 20:
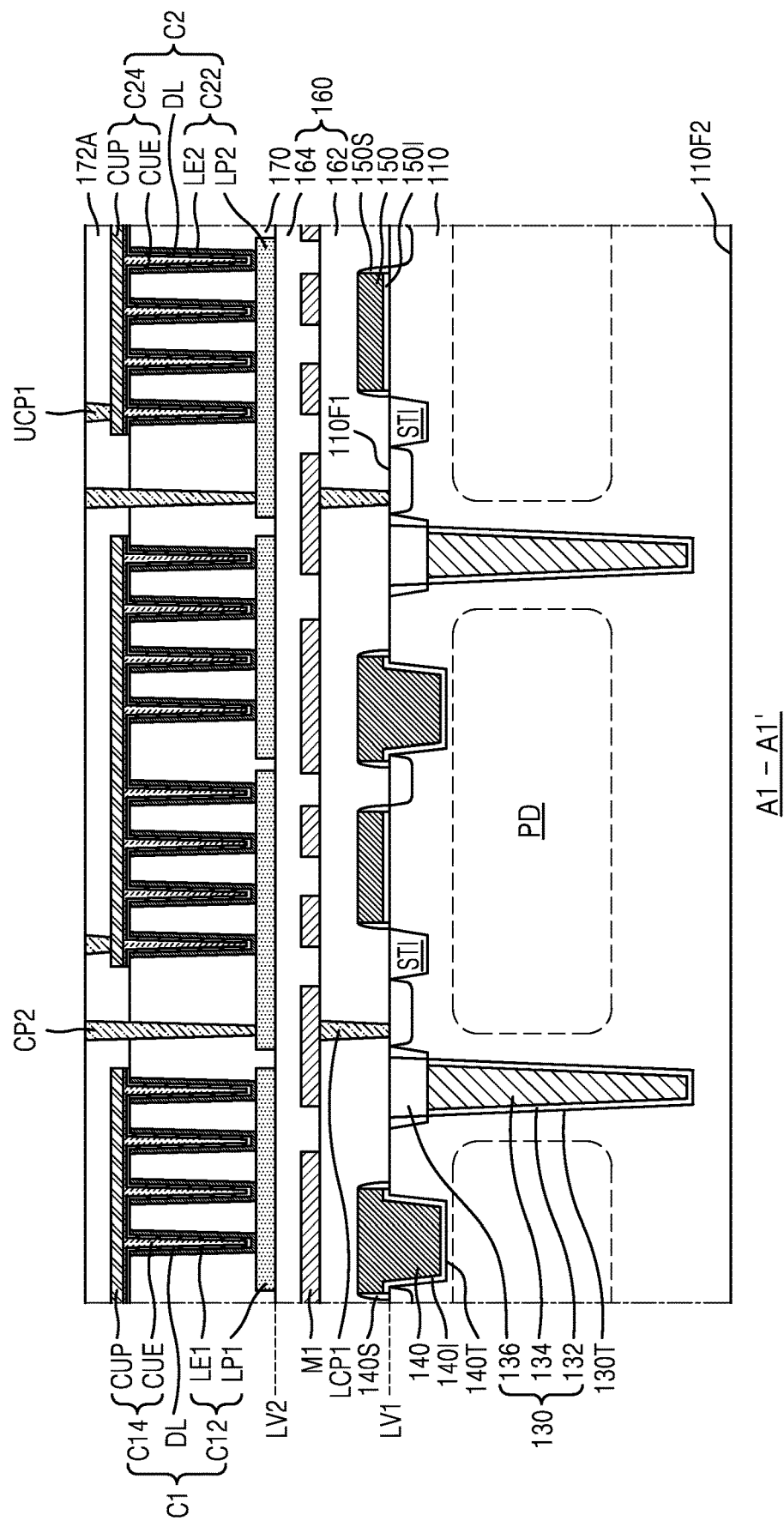

Referring to FIG. 20, the upper contact hole UCPH and the contact hole CPH may be filled with a conductive layer, and an upper portion of the conductive layer may be planarized so that a top surface of the first insulating layer 172A may be exposed. Thus, a first upper contact plug UCP1 may be formed in the upper contact hole UCPH and first to third contact plugs CP1, CP2, and CP3 (see FIGS. 5 and 6) may be formed in the contact holes CPH.

Figure 21:
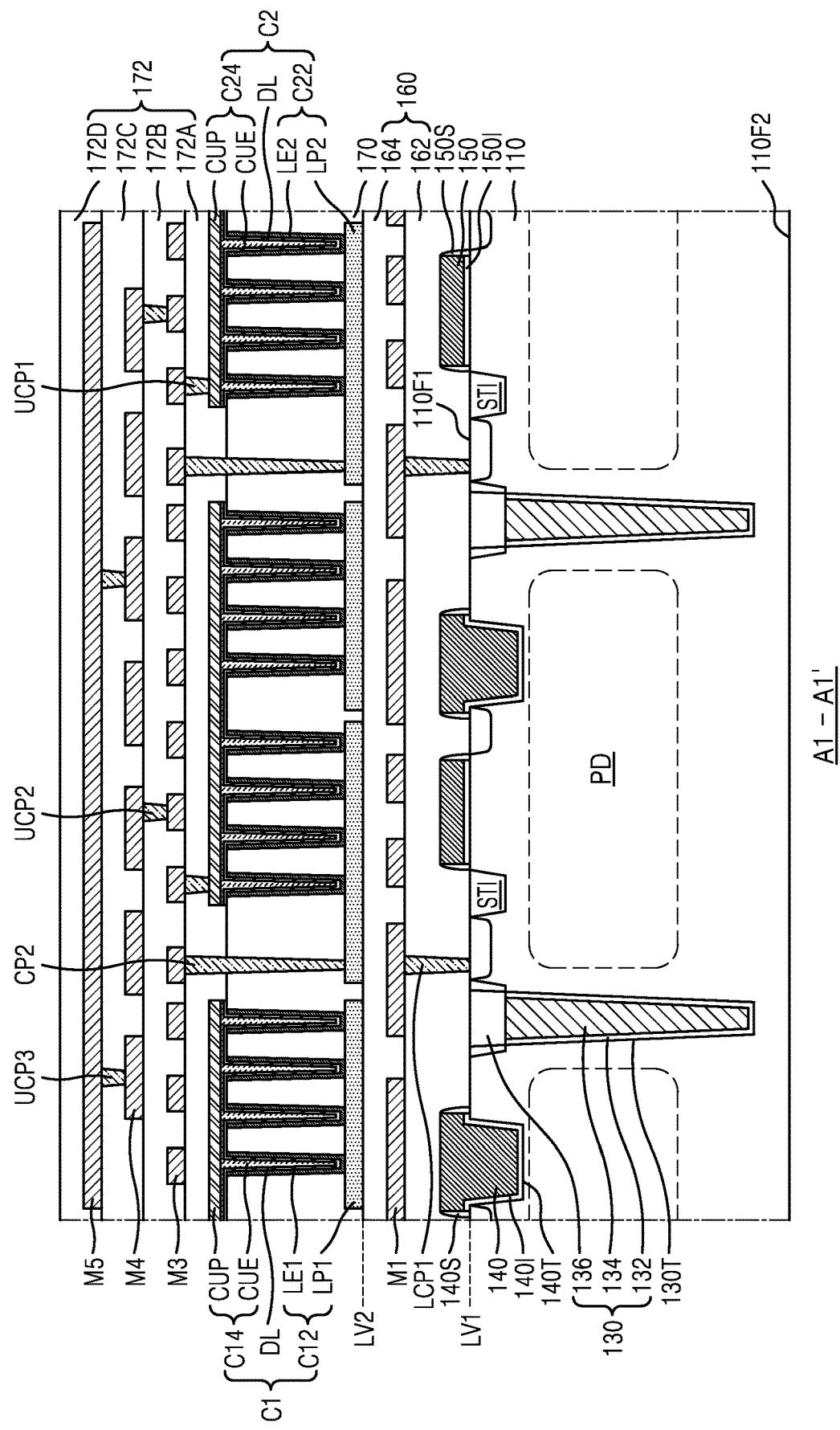

Referring to FIG. 21, a process of forming a conductive layer on the first insulating layer 172A, a process of patterning the conductive layer, and a process of forming an insulating layer to cover the patterned conductive layer may be repeatedly performed, thereby forming a second interlayer insulating film 172, which includes the first to fourth insulating layers 172A, 172B, 172C, and 172D, and third to fifth wiring layers M3, M4, and M5. For example, the third wiring layer M3 may be formed on the first insulating layer 172A and covered by the second insulating layer 172B, the fourth wiring layer M4 may be formed on the second insulating layer 172B and covered by the third insulating layer 172C, and the fifth wiring layer M5 may be formed on the third insulating layer 172C and covered by the fourth insulating layer 172D. A first upper contact plug UCP1 may be formed on the upper pad electrode CUP to pass through the first insulating layer 172A to electrically connect the upper pad electrode CUP and the third wiring layer M3. A second upper contact plug UCP2 may pass through the second insulating layer 172B and connect the third wiring layer M3 to the fourth wiring layer M4. A third upper contact plug UCP3 may pass through the third insulating layer 172C and connect the fourth wiring layer M4 to the fifth wiring layer M5.

Figure 22:
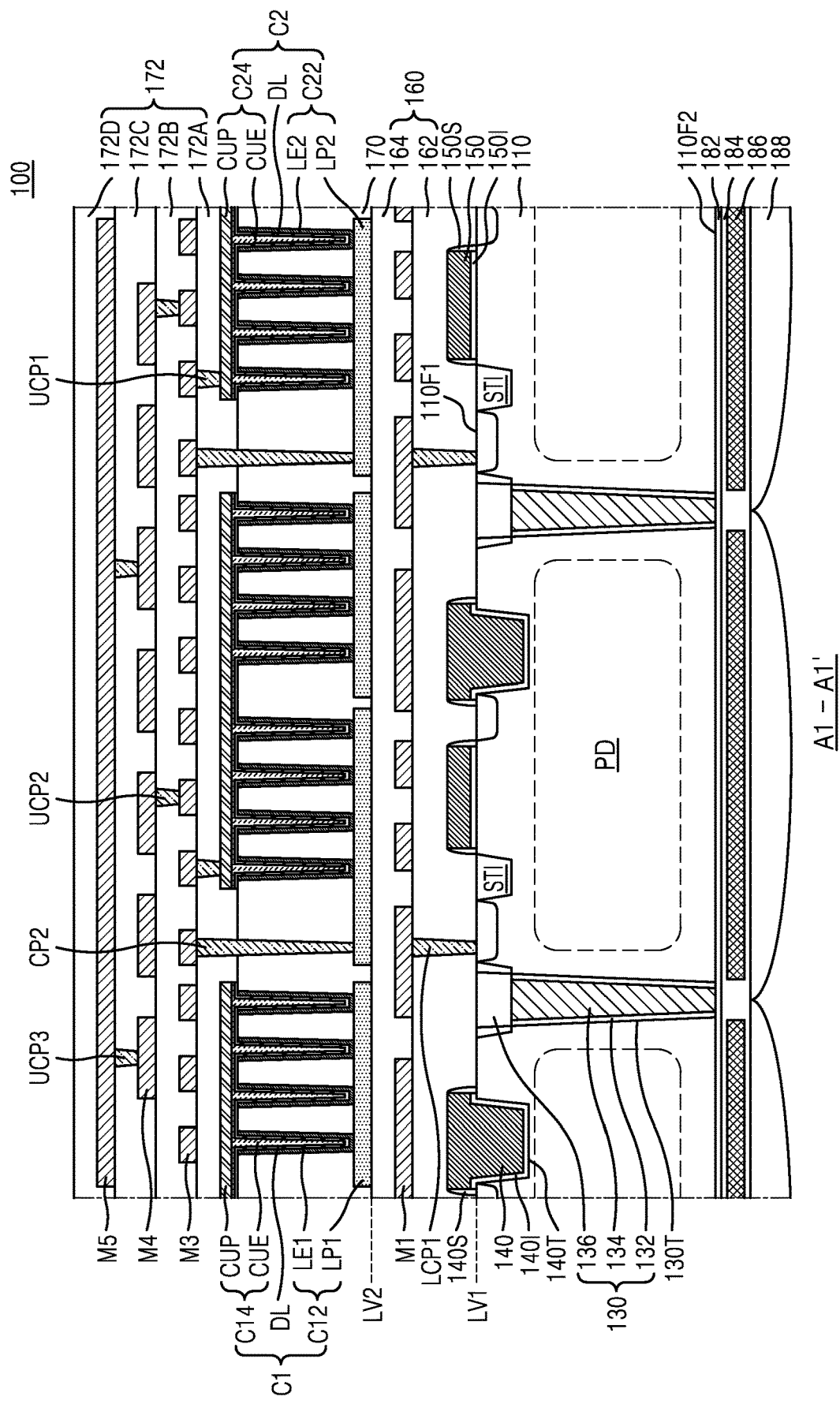

Referring to FIG. 22, a support substrate may be adhered to a first surface 110F1 of the semiconductor substrate 110 including the above described capacitor structures and wiring layers, and the semiconductor substrate 110 may be reversed so that a second surface 110F2 of the semiconductor substrate 110 may face upward.

Subsequently, a planarization process, such as a chemical mechanical polishing (CMP) process or an etchback process, may be performed so that a top surface of a pixel device isolation film 130 (e.g., an end portion of the pixel device isolation film 130 adjacent to the second surface 110F2 of the semiconductor substrate 110) may be exposed, and thus, a portion of the semiconductor substrate 110 may be removed from the second surface 110F2 of the semiconductor substrate 110.

Afterwards, a rear insulating layer 182 may be formed on the second surface 110F2 of the semiconductor substrate 110. The rear insulating layer 182 may be formed over the entire area of the second surface 110F2 of the semiconductor substrate 110 to cover the pixel device isolation layer 130.

Subsequently, a passivation layer 184 may be formed on the rear insulating layer 182, and a color filter 186 and a microlens 188 may be formed on the passivation layer 184.

The manufacture of the image sensor 100 may be completed due to the above-described processes.

According to an example embodiment of the present inventive concept, even when a plasma-related process is used in a process of forming the first capacitor C1 and the second capacitor C2, because the first and second lower pad electrodes LP1 and LP2 remain electrically insulated from the semiconductor substrate 110, plasma damage may not be built up in the semiconductor substrate 110, especially, in the impurity region N+ of the calibration transistor CAL. Accordingly, white spots may be prevented from occurring due to a junction leakage current, and thus, the image sensor 100 may be prevented from causing noise.

Figure 23:
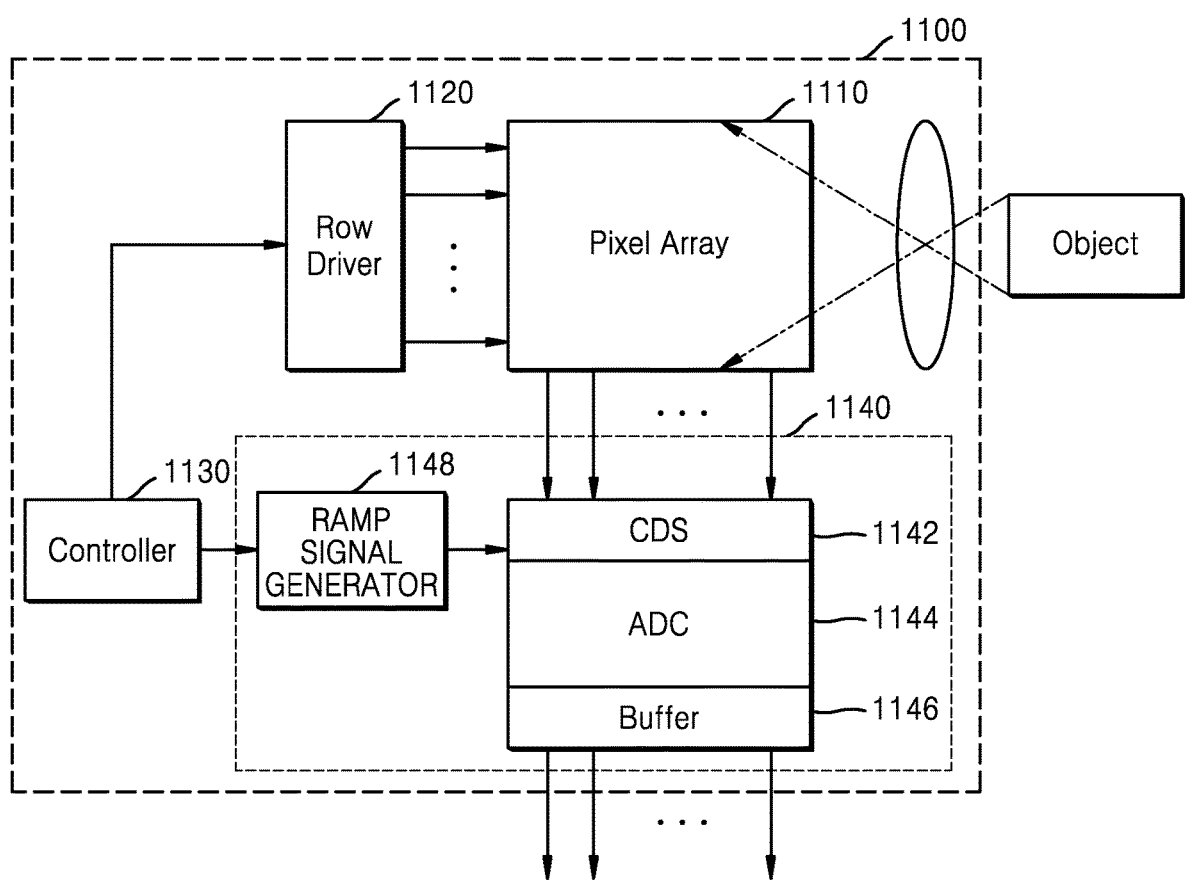
FIG. 23 is a block diagram of a configuration of an image sensor according to an example embodiment of the present inventive concept.

FIG. 23 is a block diagram of a configuration of an image sensor 1100 according to an example embodiment of the present inventive concept.

Referring to FIG. 23, the image sensor 1100 may include a pixel array 1110, a controller 1130, a row driver 1120, and a pixel signal processor 1140. The image sensor 1100 may include at least one of the image sensors 100, 100A, 100B, 100C, or 200 described above with reference to FIGS. 1 to 13.

The pixel array 1110 may include a plurality of unit pixels arranged two-dimensionally, and each of the unit pixels may include a photoelectric conversion element. The photoelectric conversion element may absorb light, generate charges, and provide an electric signal (or an output voltage) corresponding to the generated charges to the pixel signal processor 1140 through a vertical signal line. The unit pixels included in the pixel array 1110 may provide one output voltage at a time in units of rows. Thus, unit pixels in one row of the pixel array 1110 may be simultaneously activated in response to a selection signal output by the row driver 1120. For example, the unit pixels included in the pixel array 1110 may be driven by a plurality of drive signals such as, for example, selection signals, reset signals, and charge transfer signals from the row driver 1120. Unit pixels in a selected row may provide an output voltage corresponding to absorbed light to an output line of a column corresponding thereto.

The controller 1130 may control the row driver 1120 such that the pixel array 1110 absorbs light to accumulate charges or temporarily stores the accumulated charges and outputs an electric signal corresponding to the stored charges to the outside of the pixel array 1110. In addition, the controller 1130 may control the pixel signal processor 1140 to measure the output voltage provided by the pixel array 1110.

The pixel signal processor 1140 may include a correlated double sampler (CDS) 1142, an analog-to-digital converter (ADC) 1144, and a buffer 1146. The output voltage converted from an optical signal (absorbed light) by the unit pixels included in the pixel array 1110 may be provided to the CDS 1142. The CDS 1142 may sample and hold the output voltage provided by the pixel array 1110. The CDS 1142 may double sample a specific noise level and a level corresponding to the generated output voltage and output a difference level corresponding to a difference between the noise level and the level corresponding to the generated output voltage. Furthermore, the CDS 1142 may receive ramp signals generated by a ramp signal generator 1148, compare the ramp signals, and output a comparison result.

The ADC 1144 may convert an analog signal corresponding to a level received from the CDS 1142 into a digital signal. The buffer 1146 may latch the digital signal, and latched signals may be sequentially output to the outside of the image sensor 1100 and transmitted to an image processor.

While the present inventive concept has been particularly shown and described with reference to the example embodiments thereof, it will be understood that various changes in form and details may be made therein without departing from the spirit and scope of the present inventive concept as defined by the appended claims.

What is claimed is:

1. An image sensor comprising:
    a semiconductor substrate having a first surface and a second surface;
    transistors disposed on the first surface of the semiconductor substrate;
    first and second lower pad electrodes spaced apart from each other on a first interlayer insulating film, the first interlayer insulating film covering the transistors;
    a mold insulating layer disposed on the first and second lower pad electrodes;
    a first lower electrode formed inside a first opening, the first opening passing through the mold insulating layer, and the first lower electrode being on the first lower pad electrode;
    a second lower electrode formed inside a second opening, the second opening passing through the mold insulating layer, and the second lower electrode being on the second lower pad electrode;
    a first wiring layer located at a vertical level lower than that of the first and second lower pad electrodes;
    a second wiring layer located at a vertical level higher than that of the first and second lower pad electrodes;
    a dielectric film and an upper electrode disposed on the first lower electrode and the second lower electrode;
    a first contact plug passing through the mold insulating layer, the first contact plug being connected to a top surface of the first lower pad electrode; and
    a second contact plug passing through the mold insulating layer, the second contact plug being connected to a top surface of the second lower pad electrode,
    wherein the second lower pad electrode is not directly connected to the first wiring layer through the second contact plug or any other contact plug, and
    the second lower pad electrode is directly connected to the second wiring layer through the second contact plug.

2. The image sensor of claim 1, wherein a bottom surface of the second lower pad electrode is entirely covered by the first interlayer insulating film.

3. The image sensor of claim 1, wherein at least one of the transistors is a calibration transistor, and
    the second lower pad electrode is connected to an impurity region of the calibration transistor through the second contact plug and the second wiring layer.

4. The image sensor of claim 3, further comprising:
    a lower contact plug passing through the first interlayer insulating film; and
    an edge wiring layer disposed on the lower contact plug and located at a vertical level the same as that of the second lower pad electrode,
    wherein the second lower pad electrode is not in direct contact with the lower contact plug.

5. The image sensor of claim 4, wherein the second lower pad electrode is connected to the impurity region of the calibration transistor through the second contact plug, the second wiring layer, the edge wiring layer, and the lower contact plug.

6. The image sensor of claim 1, wherein the second lower pad electrode comprises:
    a main pad portion having a rectangular horizontal cross-section; and
    an extension protruding from the main pad portion,
    wherein the second contact plug is on a top surface of the extension.

7. The image sensor of claim 1, wherein a bottom surface of the first lower pad electrode is entirely covered by the first interlayer insulating film.

8. The image sensor of claim 7, wherein the first lower pad electrode comprises:
    a main pad portion having a rectangular horizontal cross-section; and
    an extension protruding from the main pad portion,
    wherein the first contact plug is on a top surface of the extension.

9. The image sensor of claim 1, further comprising an upper pad electrode disposed on the upper electrode,
    wherein the upper pad electrode comprises a doped semiconductor material.

10. An image sensor comprising:
a semiconductor substrate having a first surface and a second surface;
a photoelectric conversion region formed in the semiconductor substrate;
transistors disposed on the first surface of the semiconductor substrate;
first and second lower pad electrodes spaced apart from each other on a first interlayer insulating film that covers the transistors, the first and second lower pad electrodes each having a main pad portion having a rectangular horizontal cross-section and an extension protruding from the main pad portion;
a plurality of first lower electrodes disposed on the first lower pad electrode;
a plurality of second lower electrodes disposed on the second lower pad electrode;
a dielectric film and an upper electrode sequentially formed on a sidewall and a top surface of each of the plurality of first lower electrodes and a sidewall and a top surface of each of the plurality of second lower electrodes;
a first contact plug located on a top surface of the extension of the first lower pad electrode; and
a second contact plug located on a top surface of the second lower pad electrode.

11. The image sensor of claim 10, further comprising a mold insulating layer disposed on the first interlayer insulating film and the first and second lower pad electrodes, the mold insulating layer comprising a first opening and a second opening,
wherein each of the plurality of first lower electrodes is inside the first opening of the mold insulating layer,
each of the plurality of first lower electrodes has a cylindrical shape,
each of the plurality of second lower electrodes is inside the second opening of the mold insulating layer, and
each of the plurality of second lower electrodes has a cylindrical shape.

12. The image sensor of claim 11, wherein the first contact plug and the second contact plug pass through the mold insulating layer.

13. The image sensor of claim 11, wherein a bottom surface of the second lower pad electrode is entirely in contact with the first interlayer insulating film, and
a bottom surface of the first lower pad electrode is entirely in contact with the first interlayer insulating film.

14. The image sensor of claim 10, wherein each of the plurality of first lower electrodes and the plurality of second lower electrodes has a pillar shape, and
the dielectric film and the upper electrode cover a sidewall and a top surface of each of the plurality of first lower electrodes and a sidewall and a top surface of each of the plurality of second lower electrodes.

15. An image sensor comprising:
a semiconductor substrate having a first surface and a second surface;
a photoelectric conversion region formed in the semiconductor substrate;
transistors disposed on the first surface of the semiconductor substrate;
first and second lower pad electrodes spaced apart from each other on a first interlayer insulating film, the first interlayer insulating film covering the transistors;
a mold insulating layer disposed on the first and second lower pad electrodes;
a first lower electrode formed inside a first opening, the first opening passing through the mold insulating layer, and the first lower electrode being on the first lower pad electrode and having a cylindrical shape;
a second lower electrode formed inside a second opening, the second opening passing through the mold insulating layer, and the second lower electrode being on the second lower pad electrode and having a cylindrical shape;
a dielectric film and an upper electrode formed on the first lower electrode and the second lower electrode;
an upper pad electrode disposed on the upper electrode, the upper pad electrode comprising a doped semiconductor material;
a second interlayer insulating film covering the mold insulating layer and the upper pad electrode;
first and second contact plugs passing through the mold insulating layer and the second interlayer insulating film, the first and second contact plugs being connected to top surfaces of the first and second lower pad electrodes, respectively;
a first wiring layer disposed on the first interlayer insulating film at a vertical level lower than that of the first and second lower pad electrodes; and
a second wiring layer disposed on the second interlayer insulating film,
wherein at least one of the transistors is a calibration transistor, and
the second lower pad electrode is connected to an impurity region of the calibration transistor through the second contact plug and the second wiring layer.

16. The image sensor of claim 15, wherein a bottom surface of the second lower pad electrode is entirely covered by the first interlayer insulating film, and
a bottom surface of the first lower pad electrode is entirely covered by the first interlayer insulating film.

17. The image sensor of claim 15, further comprising:
a lower contact plug passing through the first interlayer insulating film; and
an edge wiring layer disposed on the lower contact plug at a vertical level the same as that of the second lower pad electrode,
wherein the second lower pad electrode is not in direct contact with the lower contact plug.

18. The image sensor of claim 15, wherein the second lower pad electrode comprises:
a main pad portion having a rectangular horizontal cross-section; and
an extension protruding from the main pad portion,
wherein the second contact plug is on a top surface of the extension.

* * * * *